United States Patent
Nomura et al.

[11] Patent Number: 5,812,325
[45] Date of Patent: Sep. 22, 1998

[54] TELESCOPING-TYPE OF ZOOM LENS

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 781,598

[22] Filed: Jan. 9, 1997

[30] Foreign Application Priority Data

Jan. 29, 1996 [JP] Japan .................................. 8-012317
Feb. 13, 1996 [JP] Japan .................................. 8-025541

[51] Int. Cl.⁶ .................................................. G02B 15/14
[52] U.S. Cl. .......................................... 359/700; 359/704
[58] Field of Search .................................... 359/700, 699, 359/701, 704, 823, 826

[56] References Cited

U.S. PATENT DOCUMENTS

| | | | |
|---|---|---|---|
| 3,663,093 | 5/1972 | Iida | 359/700 |
| 3,817,601 | 6/1974 | Colaice et al. | 359/700 |
| 4,324,457 | 4/1982 | Tomuri | 359/706 |
| 4,411,498 | 10/1983 | Muryoi | 359/704 |
| 4,944,030 | 7/1990 | Haraguchi et al. | 396/62 |
| 5,043,752 | 8/1991 | Kohmoto | 396/72 |
| 5,144,494 | 9/1992 | Sekiguchi | 359/700 |
| 5,231,449 | 7/1993 | Nomura | 396/542 |
| 5,245,476 | 9/1993 | Shono | 359/699 |
| 5,469,300 | 11/1995 | Nomura | 359/700 |
| 5,488,513 | 1/1996 | Tanaka | 359/699 |
| 5,589,987 | 12/1996 | Tanaka | 359/701 |

FOREIGN PATENT DOCUMENTS

| 102739 | 3/1984 | European Pat. Off. . |
|---|---|---|
| 0344806 | 12/1989 | European Pat. Off. . |

*Primary Examiner*—Georgia Y. Epps
*Assistant Examiner*—Ricky Mack
*Attorney, Agent, or Firm*—Greenblum & Bernstein, P.L.C.

[57] ABSTRACT

A zoom lens includes an outer barrel driven to rotate about an optical axis of the zoom lens which includes at least one first guide groove formed on an inner periphery of the zoom lens and extending in a direction of the optical axis, and an inner barrel positioned inside the outer barrel so that the outer barrel is rotatable relative to the inner barrel about the optical axis. The inner barrel includes at least one second guide groove formed on an inner periphery and extending in the direction of the optical axis. The at least one first guide groove is defined by at least one inward projection which projects inwardly from the inner periphery of the outer barrel. The at least one second guide groove is defined by an outward projection which projects outwardly from an outer periphery of the inner barrel. The at least one inward projection and the outward projection are positioned in an annular space formed between the outer barrel and the inner barrel such that a distance between the optical axis and a surface of the at least one inward projection closest to the optical axis is less than a distance between the optical axis and a surface of the outward projection farthest from the optical axis in a radial direction perpendicular to the optical axis.

10 Claims, 21 Drawing Sheets

D1<D2

TELESCOPING-TYPE OF ZOOM LENS

BACKGROUND OF THE INVENTION

1. Field of the Invention

The present invention relates to a zoom lens. More particularly, the present invention relates to a telescoping-type of zoom lens having a plurality of telescoping barrels which are concentrically arranged to advance from or retract into a stationary barrel of the zoom lens to effect a zooming operation.

2. Description of the Related Art

In recent years so-called "zoom compact cameras", namely, compact cameras having a zoom lens, have been widely produced. Such types of cameras are usually provided with a telescoping-type of zoom lens having a plurality of telescoping barrels concentrically arranged to advance from or retract into the camera body when the focal length is varied for the purpose of reducing the thickness of the camera when not in use (i.e., in a housed state). However, due to this structure, the diameter of the zoom lens tends to increase, which results in an increase in the height and width of the camera. For this reason, although the thickness of the housed-state zoom compact camera has been decreased (by increasing the number of telescoping barrels of the zoom lens), the width and height of the camera have been increased. Accordingly, it is difficult to decrease the thickness of a zoom compact camera when in the housed state while not increasing the width and height of the zoom compact camera.

SUMMARY OF THE INVENTION

An object of the present invention is to provide a telescoping-type of zoom lens which includes a plurality of concentrically arranged telescoping barrels having a small diameter while also decreasing the length of the zoom lens when not in use.

To achieve the object mentioned above, according to an aspect of the present invention, there is provided a zoom lens which includes an outer barrel driven to rotate about an optical axis of the zoom lens which includes at least one first guide groove formed on an inner periphery and extending in a direction of the optical axis, and an inner barrel positioned inside the outer barrel so that the outer barrel is rotatable relative to the inner barrel about the optical axis which includes at least one second guide groove formed on an inner periphery and extending in the direction of the optical axis. The at least one first guide groove is defined by at least one inward projection which projects inwardly from the inner periphery of the outer barrel, and the at least one second guide groove is defined by an outward projection which projects outwardly from an outer periphery of the inner barrel. Also, the at least one inward projection and the outward projection are positioned in an annular space formed between the outer barrel and the inner barrel such that a distance between the optical axis and a surface of the at least one inward projection closest to the optical axis is less than a distance between the optical axis and a surface of the outward projection farthest from the optical axis in a radial direction perpendicular to the optical axis. With this structure, the outer barrel and the inner barrel are arranged more closely to each other in a radial direction as compared with a conventional zoom lens camera, which contributes to making the diameter of the zoom lens barrel small and compact.

Preferably, the at least one inward projection is comprised of two inward projections which extend adjacent to each other in the direction of the optical axis.

According to another aspect of the present invention, there is provided a zoom lens which includes an outer barrel driven to rotate about an optical axis of the zoom lens which includes at least one first guide groove formed on an inner periphery and extending in a direction of the optical axis, and an inner barrel positioned inside the outer barrel so that the outer barrel is rotatable relative to the inner barrel about the optical axis which includes at least one second guide groove formed on an inner periphery and extending in the direction of the optical axis and at least one lead slot extending obliquely to the optical axis. The zoom lens also includes an innermost barrel positioned inside the inner barrel so that the innermost barrel is rotatable relative to the inner barrel about the optical axis which includes at least one follower pin that engages with the at least one first guide groove through the at least one lead slot, and a linear guide member guided along the optical axis without rotating about the optical axis which includes at least one engaging projection that engages with the at least one second guide groove. The at least one first guide groove is defined by at least one inward projection which projects inwardly from the inner periphery of the outer barrel, and the at least one second guide groove includes an outward projection which projects outwardly from an outer periphery of the inner barrel. Also, the at least one inward projection and the outward projection are positioned in an annular space formed between the outer barrel and the inner barrel such that a distance between the optical axis and a surface of the at least one inward projection closest to the optical axis is less than a distance between the optical axis and a surface of the outward projection farthest from the optical axis in a radial direction perpendicular to the optical axis.

According to another aspect of the present invention, there is provided a zoom lens which includes an outer barrel driven to rotate about an optical axis of the zoom lens which includes at least one first guide groove formed on an inner periphery and extending in a direction of the optical axis, and an inner barrel positioned inside the outer barrel so that the outer barrel is rotatable relative to the inner barrel about the optical axis which includes at least one second guide groove formed on an inner periphery and extending in the direction of the optical axis. The at least one first guide groove includes at least one inward projection which projects inwardly from the inner periphery of the outer barrel, and the at least one second guide groove includes an outward projection which projects outwardly from an outer periphery of the inner barrel. Also, the at least one inward projection and the outward projection are positioned in an annular space formed between the outer barrel and the inner barrel on a circumference having a center coincident with the optical axis.

According to yet another aspect of the present invention, there is provided a zoom lens which includes an outer barrel driven to rotate about an optical axis of the zoom lens which includes at least one first guide groove formed on an inner periphery and extending in a direction of the optical axis, and an inner barrel positioned inside the outer barrel so that the outer barrel is rotatable relative to the inner barrel about the optical axis which includes at least one second guide groove formed on an inner periphery and extending in the direction of the optical axis. The at least one first guide groove includes at least one inward projection which projects inwardly from the inner periphery of the outer barrel, and the at least one second guide groove includes an outward projection which projects outwardly from an outer periphery of the inner barrel. Also, the at least one inward projection and the outward projection are positioned in an annular space formed between the outer barrel and the inner barrel such that the at least one inward projection would interfere with the outward projection in the case where the outer barrel is rotated by a rotational amount which is beyond a predetermined maximum rotational amount of the outer barrel relative to the inner barrel.

According to yet another aspect of the present invention, there is provided a zoom lens which includes an outer barrel driven to rotate about an optical axis of the zoom lens which includes at least one first guide groove formed on an inner periphery thereof and extending in a direction of the optical axis, and an inner barrel positioned inside the outer barrel so that the outer barrel is rotatable relative to the inner barrel about the optical axis which includes at least one second guide groove formed on an inner periphery thereof and extending in the direction of the optical axis. The at least one first guide groove is defined by at least one inward projection which projects inwardly from the inner periphery of the outer barrel, and the at least one second guide groove is defined by an outward projection which projects outwardly from an outer periphery of the inner barrel. In addition, a thickness of the annular space along a radial direction perpendicular to the optical axis is less than a sum of a thickness of the at least one inward projection and a thickness of the outward projection.

The present disclosure relates to subject matter contained in Japanese Patent Application Nos. 8-12317, filed on Jan. 26, 1996, and 8-25541, filed on Feb. 13, 1996, which are expressly incorporated herein by reference in their entireties.

BRIEF DESCRIPTION OF THE DRAWINGS

The invention will be described below in detail with reference to the accompanying drawings in which similar elements are indicated by similar reference numerals, and wherein.

DESCRIPTION OF THE PREFERRED EMBODIMENT

Figure 13:
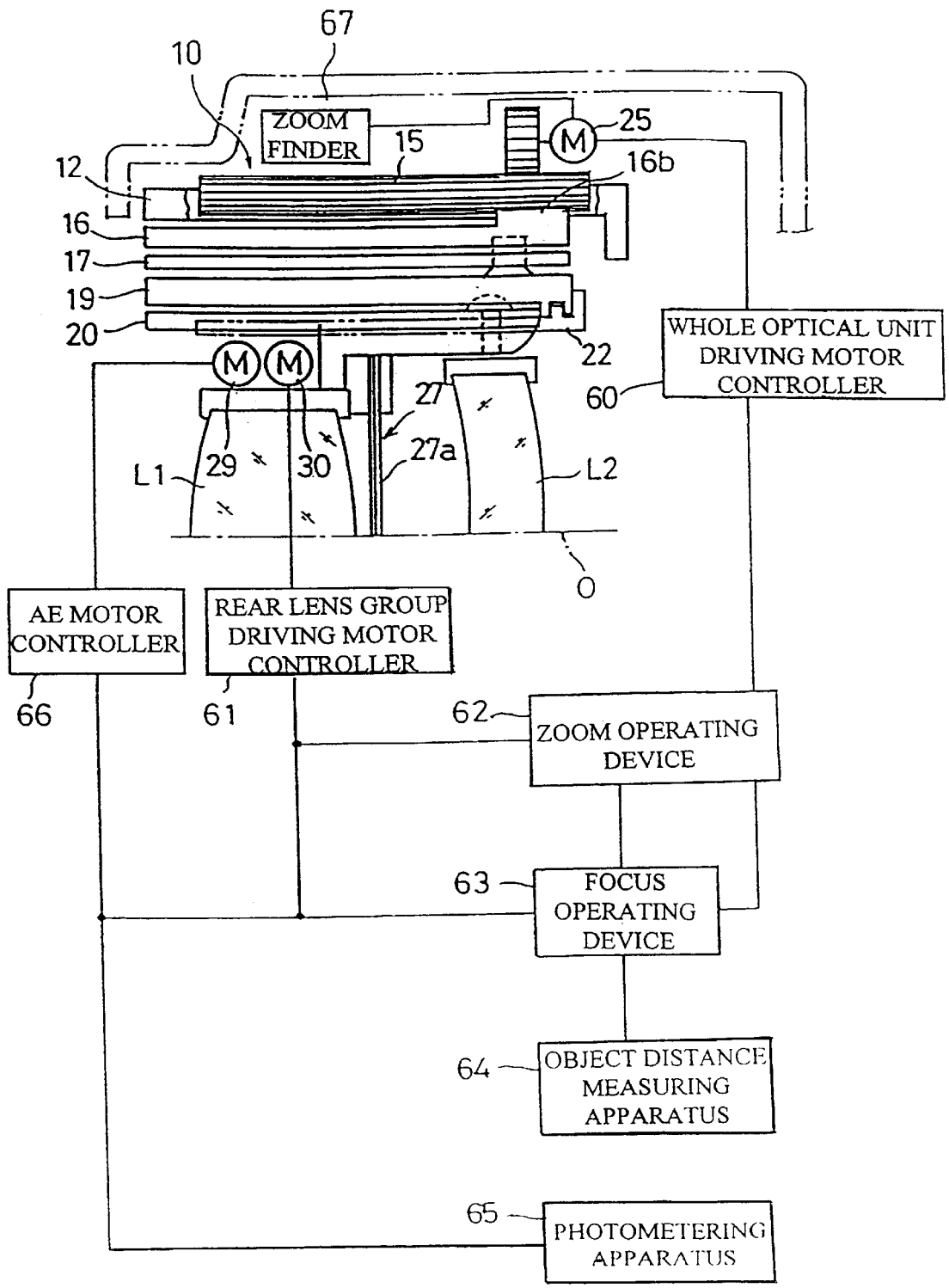
FIG. 13 is a block diagram of a controlling system for controlling an operation of the zoom lens barrel.

FIG. 13 is a schematic representation of various elements which comprise a preferred embodiment of a zoom lens camera to which the present invention is applied. A concept of the present zoom lens camera will now be described with reference to FIG. 13.

The zoom lens camera is provided with a zoom lens barrel (zoom lens) 10 of a three-stage delivery type (telescoping type) having three moving barrels, namely a first moving barrel 20, a second moving barrel 19 and a third moving barrel (rotational barrel) 16, which are concentrically arranged in this order from an optical axis O. In the zoom lens barrel 10, two lens groups are provided as a photographic optical system, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button (not shown) provided on the camera body. When the zoom operation device 62 is operated, the whole optical unit driving motor controller 60 drives a whole optical unit driving motor 25 to move the front lens group L1 and the rear lens group L2, rearwardly or forwardly without regard to a focal length and a focal point. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies in accordance with the variation of the focal length through the operation of the zoom operating device 62. Therefore, the photographer can perceive the variation of the focal length by observing the variation of image magnification of the visual field of the finder. In addition, the focal length, as set by the operation of the zoom operating device 62, may be a value indicated by a value on an LCD (liquid crystal display) panel (not shown) or the like.

When the focus operating device 63 is operated, the whole optical unit driving motor controller 60 drives the whole optical unit driving motor 25. At the same time, the rear lens group driving motor controller 61 drives a rear lens group driving motor 30. The driving of the whole optical unit driving motor controller 60 and the rear lens group driving motor controller 61 causes the front and rear lens groups L1 and L2 to be moved to respective positions corresponding to a set focal length and a detected object distance, thereby the zoom lens is focused on the subject.

Specifically, the focus operating device 63 is provided with a release button (not shown) provided on an upper wall of the camera body. A photometering switch and a release switch (both not shown) are synchronized with the release button. When the release button is half-depressed (half step), the focus operating device 63 turns the photometering switch ON, and the object distance measuring and photometering commands are respectively input to the object distance measuring apparatus 64 and the photometering apparatus 65.

When the release button is fully depressed (full step), the focus operating device 63 turns the release switch ON, and according to the result of the object distance measurement and a set focal length, the whole optical unit driving motor 25 and the rear lens group driving motor 30 are driven, and the focusing operation is executed, in which the front lens group L1 and the rear lens group L2 move to the focusing position. Further, an AE motor 29 of an AF/AE (i.e., autofocus/autoexposure) shutter unit (electrical unit) 21 (FIG. 11) is driven via the AE motor controller 66 to actuate a shutter 27. During the shutter action, the AE motor controller 66 drives the AE motor 29 to open shutter blades 27*a* of the shutter 27 for a specified period of time according to the photometering information output from the photometering apparatus 65.

When the zoom operative device 62 is operated, the zoom operating device 62 drives the whole optical unit driving motor 25 to move the front and rear lens groups L1 and L2 together as a whole in the direction of the optical axis O (optical axis direction). The rear lens group driving motor 30 may also be driven via the rear lens group driving motor controller 61 to move the rear lens group L2 relative to the first lens group L1. However, this may not be performed under the conventional concept of zooming in which the focal length is varied sequentially without moving the position of the focal point.

When the zoom operating device 62 is operated, the following two modes are available:

1. A mode to move the front lens group L1 and the rear lens group L2 in the optical axis direction without varying the distance therebetween by driving only the whole optical unit driving motor 25; and
2. A mode to move the front lens group L1 and the rear lens group L2 in the optical axis direction while varying the distance therebetween by driving both the whole optical unit driving motor 25 and the rear lens group driving motor 30.

In mode 1, during a zooming operation an in-focus condition cannot be obtained at all times with respect to a subject located at a specific distance. However, in a lens-shutter type camera, since the image of the subject is not observed through the photographing optical system, but through the finder optical system provided separately from the photographing optical system, it is sufficient that the subject is only focused when the shutter is released. In mode 2, during a zooming operation the front lens group L1 and the rear lens group L2 are moved without regard to whether the focal point moves, and when the shutter is released, the focusing operation (focus adjusting operation) is carried out by moving both the whole optical unit driving motor 25 and the rear lens group driving motor 30.

When the focus operating device 63 is operated in at least one part of the focal length range set by the zoom operating device 62, the whole optical unit driving motor 25 and the rear lens group driving motor 30 are driven to bring the subject into focus. The amount of movement of each lens group L1 or L2 by the whole optical unit driving motor 25 and the rear lens group driving motor 30 is determined in accordance with subject distance information provided from the object distance measuring apparatus 64, and focal length information set by the zoom operating device 62. By moving both the whole optical unit driving motor 25 and the rear lens group driving motor 30 when the focus operating device 63 is operated, the position of the lens groups L1, L2 can be flexibly controlled in comparison to lens movements controlled by cam.

The zoom lens camera of this embodiment can also be controlled in a manner such that only the magnification of the zoom finder 67 and the focal length information are varied during an operation of the zoom operating device 62, without driving either the whole optical unit driving motor 25 or the rear lens group driving motor 30. Under this type of control, when the focus operating device 63 is operated, both the whole optical unit driving motor 25 and the rear lens group driving motor 30 are moved simultaneously according to the focal length information and the subject distance information obtained by the object distance measuring apparatus 64 to move the front lens group L1 and the rear lens group L2 to respective positions determined according to the focal length and the subject distance information.

An embodiment of the zoom lens barrel according to the above concept will now be described with reference to mainly FIGS. 11 and 12.

The overall structure of the zoom lens barrel 10 will firstly be described.

The zoom lens barrel 10 is provided with the first moving barrel 20, the second moving barrel 19, the third moving barrel 16, and a fixed lens barrel block 12. The third moving barrel 16 is engaged with a cylindrical portion 12*p* of the fixed lens barrel block 12, and moves in the optical axis direction upon being rotated. The third moving barrel 16 is provided on an inner periphery thereof with a linear guide barrel (cam ring or second barrel) 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole optical unit driving motor 25 is secured to the fixed lens barrel block 12. A shutter mounting stage 40 is secured to the first moving barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

Figure 11:
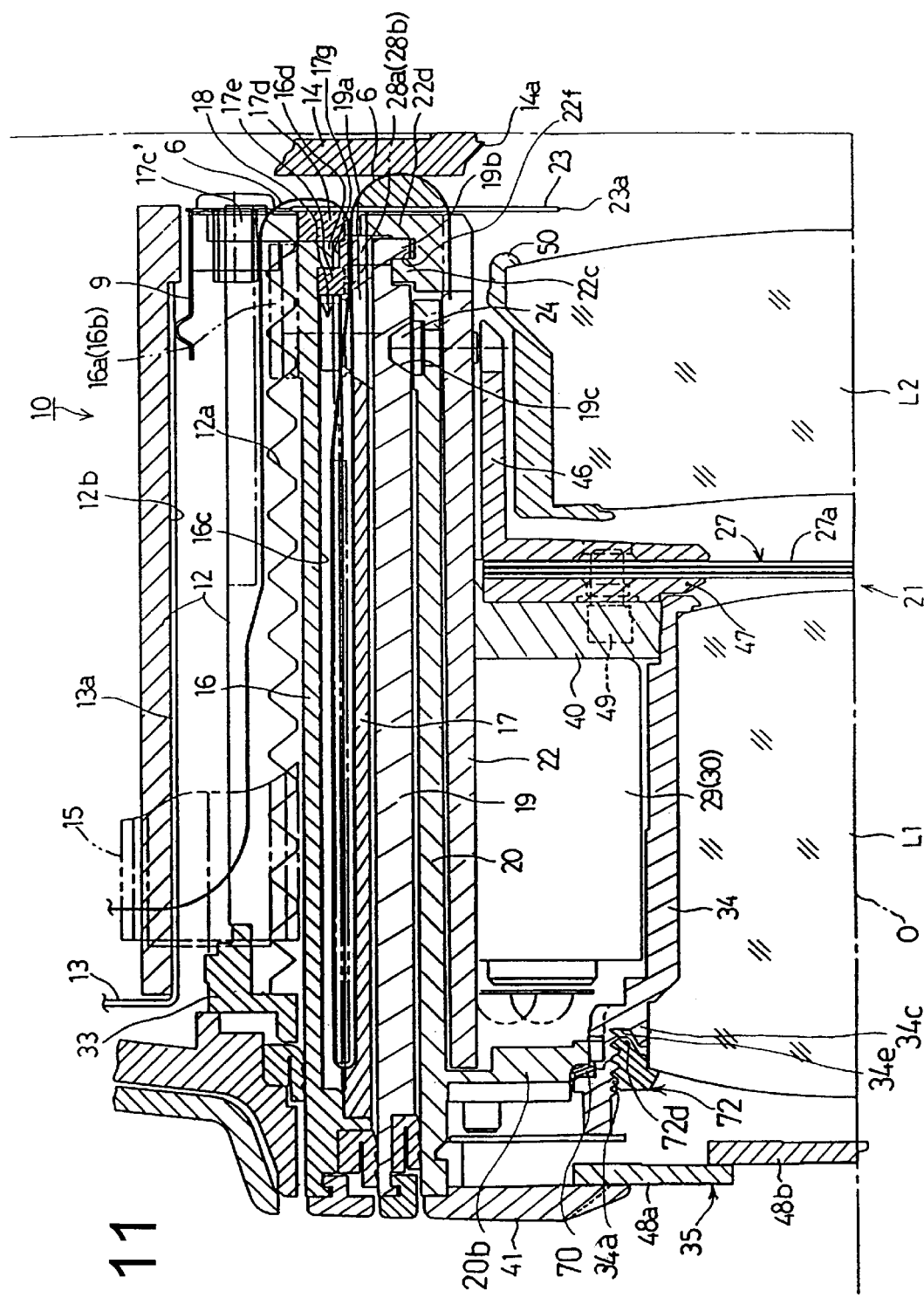
FIG. 11 is a sectional view of an upper part of the zoom lens barrel in the housed state.

An O-ring 70, made of a rubber or the like, is positioned between an outer peripheral circumferential surface of the front end of the lens supporting barrel 34, and an inner peripheral circumferential surface of an inner flange portion 20b integrally formed in the front end of the first moving barrel 20 as shown in FIG. 11. The O-ring 70 prevents water from penetrating the zoom lens barrel 10 at the front end thereof between the first moving barrel 20 and the lens supporting barrel 34.

Figure 19:
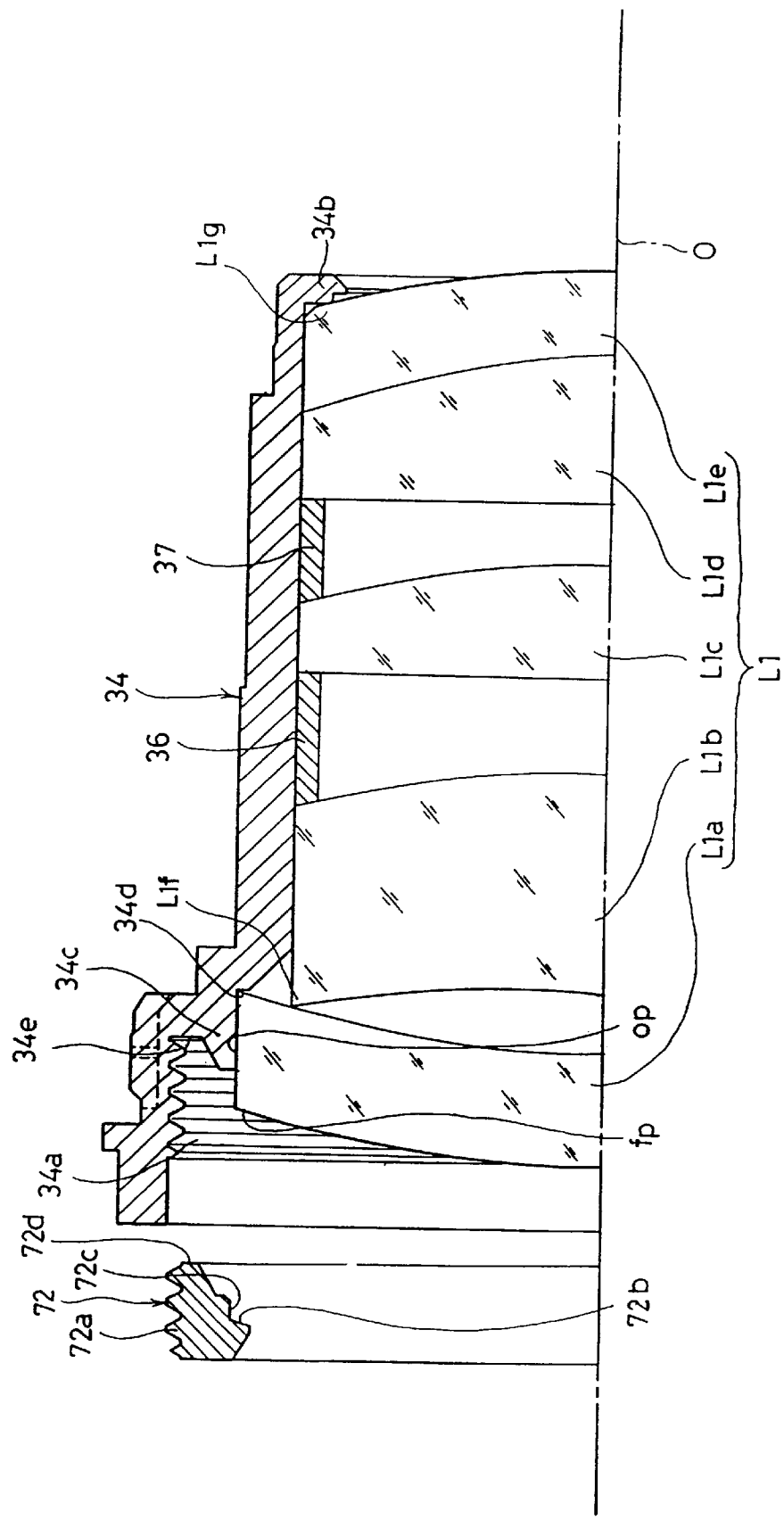
FIG. 19 is a sectional view of an upper part of a lens supporting barrel which supports a front lens group therein, and a lens fixing ring which is to be screw-engaged with the lens supporting barrel.

As shown in FIG. 19, the front lens group L1 consists of five lenses, namely a first lens (frontmost lens) L1a, a second lens L1b, a third lens L1c, a fourth lens L1d and a fifth lens L1e in this order from an object side to an image side, i.e., from the left hand side to the right hand side as viewed in FIG. 19.

A front positioning ring 36 for determining a distance between the second lens L1b and the third lens L1c is positioned and held between the second lens L1b and the third lens L1c. An outer peripheral surface of the positioning ring 36 is fitted on an inner peripheral surface of the lens supporting barrel 34. Likewise, a rear positioning ring 37 for determining a distance between the third lens L1c and the fourth lens L1d is positioned and held between the third lens L1c and the fourth lens L1d. An outer peripheral surface of the positioning ring 37 is fitted on an inner peripheral surface of the lens supporting barrel 34. The rear surface of the fourth lens L1d and the front surface of the fifth lens L1e are cemented to each other, so that the fourth and fifth lenses L1d, L1e are formed as a cemented or composite lens. A front circumferential edge L1f of the second lens L1b along the circumferential edge contacts the rear surface of the first lens L1a. A rear circumferential edge L1g of the fifth lens L1e along the circumferential edge thereof contacts an inwardly-projecting flange 34b formed integral with the rear end of the lens supporting barrel 34.

Figure 20:
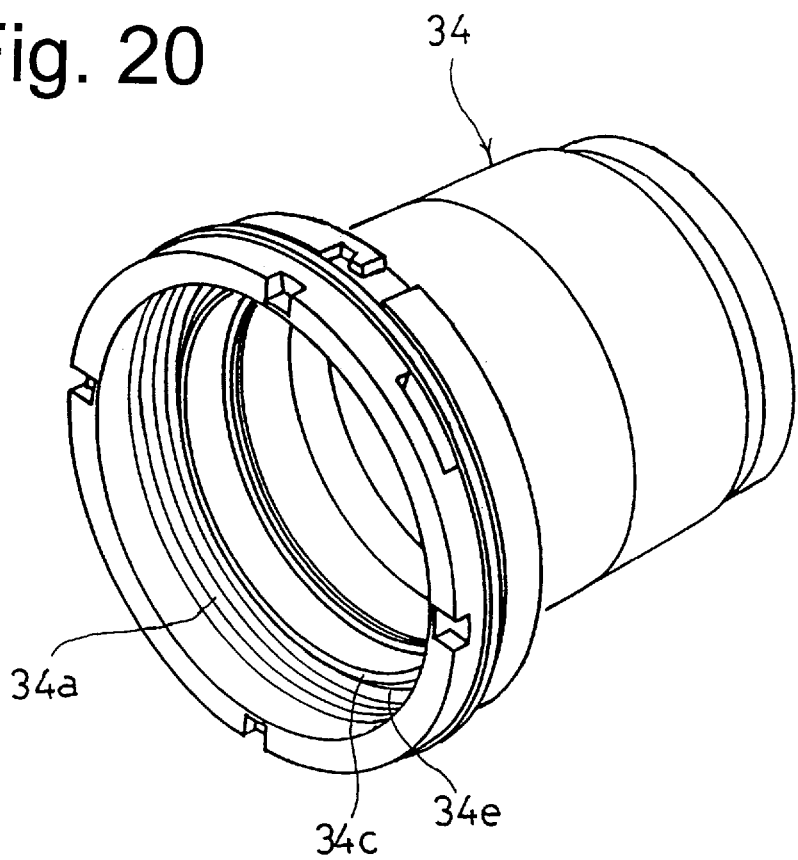
FIG. 20 is an enlarged perspective view of the lens supporting barrel shown in FIG. 19.
Figure 21:
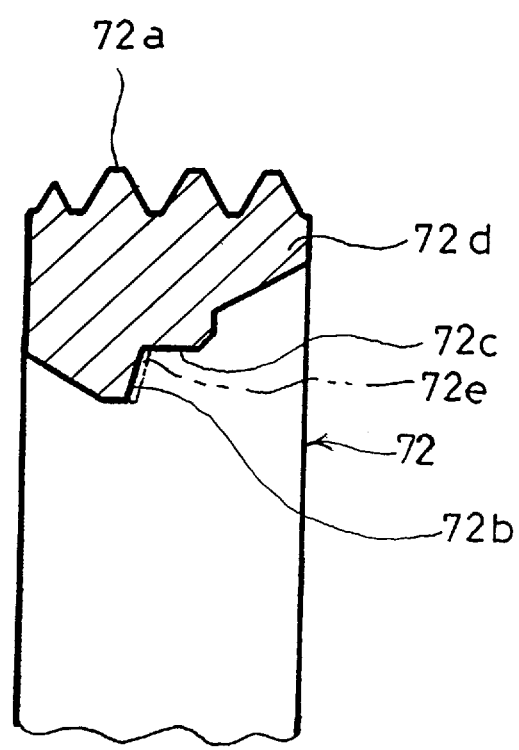
FIG. 21 is an enlarged sectional view of a part of the lens fixing ring shown in FIG. 19.

A female thread 34a is formed on an inner periphery of a front part of the lens supporting barrel 34, as shown in FIGS. 20 or 21. A lens fixing ring 72, for fixing the first lens L1a to the lens support barrel 34, engages with the lens supporting barrel 34. With this arrangement, a male thread 72a formed on the outer peripheral surface of the lens fixing ring 72 meshes with the female thread 34a. A circular abutting surface 72b is formed on the lens fixing ring 72 on an inner peripheral surface. The circular abutting surface 72b comes into contact with a circumferential portion fp of the front surface of the first lens L1a in a state when the lens fixing ring 72 is properly screw-engaged with the lens supporting barrel 34. The circular abutting surface 72b is formed to be substantially parallel to the circumferential portion fp so that the circular abutting surface 72b and the circumferential portion fp may be brought tightly into contact with each other when the lens fixing ring 72 is properly screw-engaged with the lens supporting barrel 34.

A supporting ring portion 34c is integrally formed with the lens supporting barrel 34. The supporting ring portion 34c is located inwardly from the female thread 34a in a radial direction of the lens supporting barrel 34. The inner peripheral surface of the supporting ring portion 34c, which extends in the optical axis direction, comes into contact with an outer circumferential edge or surface op of the first lens L1a. An annular positioning surface 34d, extending substantially normal to the optical axis O, is formed on the lens supporting barrel 34 immediately behind the supporting ring portion 34c. The circumferential edge of the rear surface of the first lens L1a comes into contact with the positioning surface 34d. With this structure, the first lens L1a is immovably held between the circular abutting surface 72b and the positioning surface 34d in the optical axis direction, and the first lens L1a is immovably held by the supporting ring portion 34c in a radial direction normal to the optical axis O.

As shown in FIG. 21, a coating 72e is coated on the circular abutting surface 72b. The coating 72e is a waterproof coating made of a synthetic resin. In the present embodiment, Fantas Coat SF-6 (trademark of a coating produced by the Japanese Company "Origin Denki Kabushiki Kaisha") is used as the coating 72e. The front surface of the first lens L1a is formed very smooth, whereas the circular abutting surface 72b of the lens fixing ring 72 is not formed as smoothly (i.e., has a rough finish) as the front surface of the first lens L1a. This is because the first lens L1a is more minutely and accurately formed than the lens fixing ring 72 since the first lens L1a is a precision optical element. Because of the differences in the finishes, in the absence of the coating 72e on the circular abutting surface 72b, a substantial gap would be formed between the circular abutting surface 72b and the circumferential portion fp. This would be the case even if the circular abutting surface 72b was properly and tightly in contact with the circumferential portion fp by properly screw-engaging the lens fixing ring 72 with the female thread 34a. As a result, water or moisture would be able to penetrate into the lens supporting barrel 34 through the substantial gap. However, in the present embodiment, the coating 72e is applied to the circular abutting surface 72b so as to make the surface thereof a smooth surface which eliminates the substantial gap between the circular abutting surface 72b and the circumferential portion fp when the circular abutting surface 72b properly contacts the circumferential portion fp. Accordingly, the coating 72e, positioned and held between the circular abutting surface 72b and the circumferential portion fp, effectively prevents water or moisture from penetrating the lens supporting barrel 34 between the circular abutting surface 72b and the circumferential portion fp when the circular abutting surface 72b is properly and tightly in contact with the circumferential portion fp by properly screw-engaging the lens fixing ring 72 with the female thread 34a.

A circular surface 72c is formed on the lens fixing ring 72. The circular surface 72c is connected to the circular abutting surface 72b and is located immediately outward in a radial direction from the circular abutting surface 72b. A front part of the outer circumferential surface op of the first lens L1a (i.e., a circumferential edge of the first lens L1a) comes into contact with the circular surface 72c when the lens fixing ring 72 properly engages with the female thread 34a. Due to the circular surface 72c contacting the outer circumferential surface op, the watertight structure between the circular abutting surface 72b and the circumferential portion fp, that is realized by the coating 72e, is enhanced. That is, a highly efficient watertight connection between the first lens L1a and the lens fixing ring 72 is realized by providing both the coating 72e and the circular surface 72c with the lens fixing ring 72.

An annular recessed portion 34e is formed on the lens supporting barrel 34 between the female thread 34a and the supporting ring portion 34c. As shown in FIG. 11, in a state where the lens fixing ring 72 is properly screw-engaged with the female thread 34a, a rear end 72d of the lens fixing ring 72 is positioned in the annular recessed portion 34e with the rear end 72d not contacting the bottom (i.e., rearmost end) of the recessed portion 34e. In particular, an annular space is formed in the annular recessed portion 34e between the rear end 72d and the bottom of the recessed portion 34e.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided on an inner periphery of the cylindrical portion 12p, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 7:
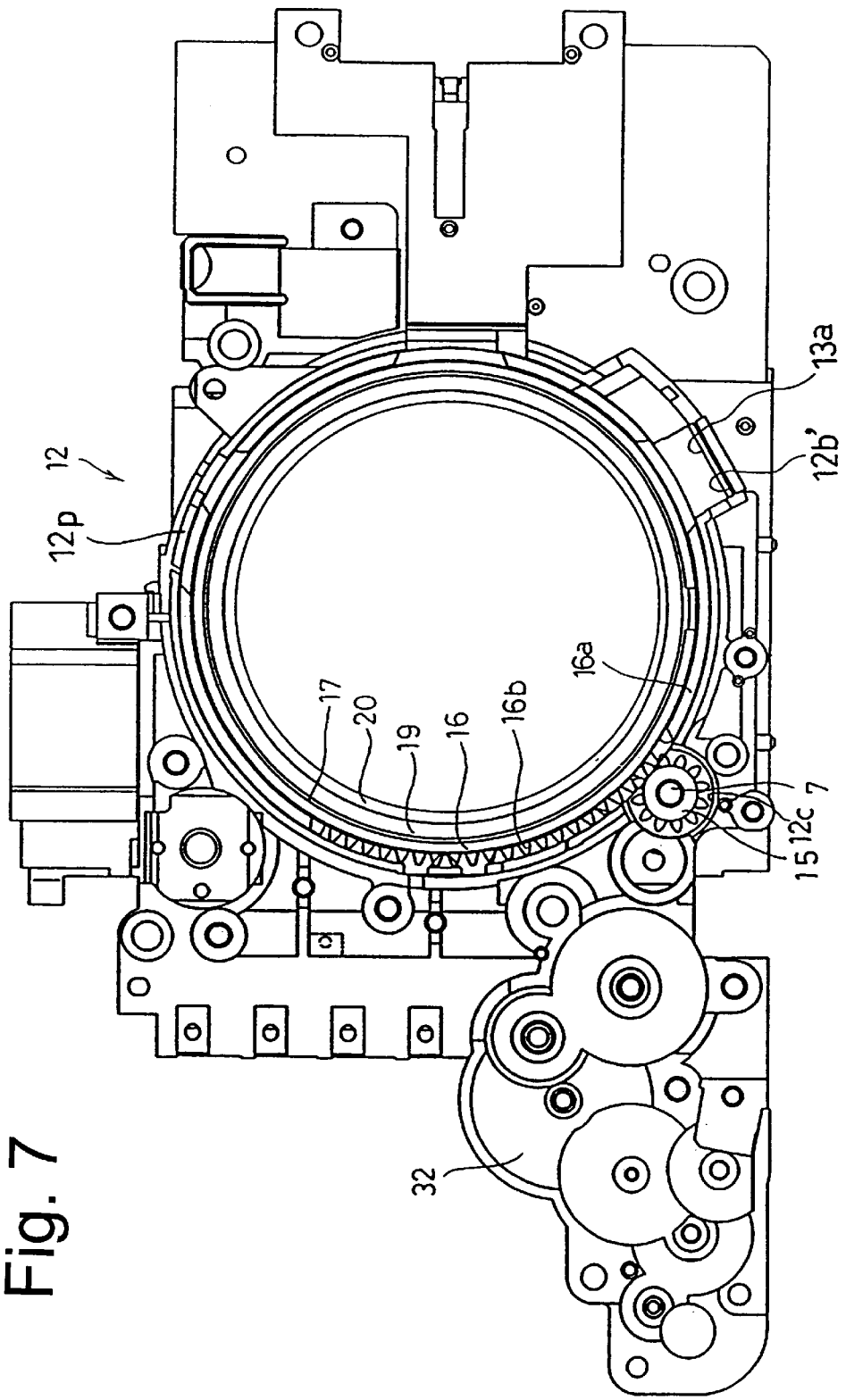
FIG. 7 is a front elevational view of a fixed lens barrel block of the zoom lens barrel.
Figure 12:
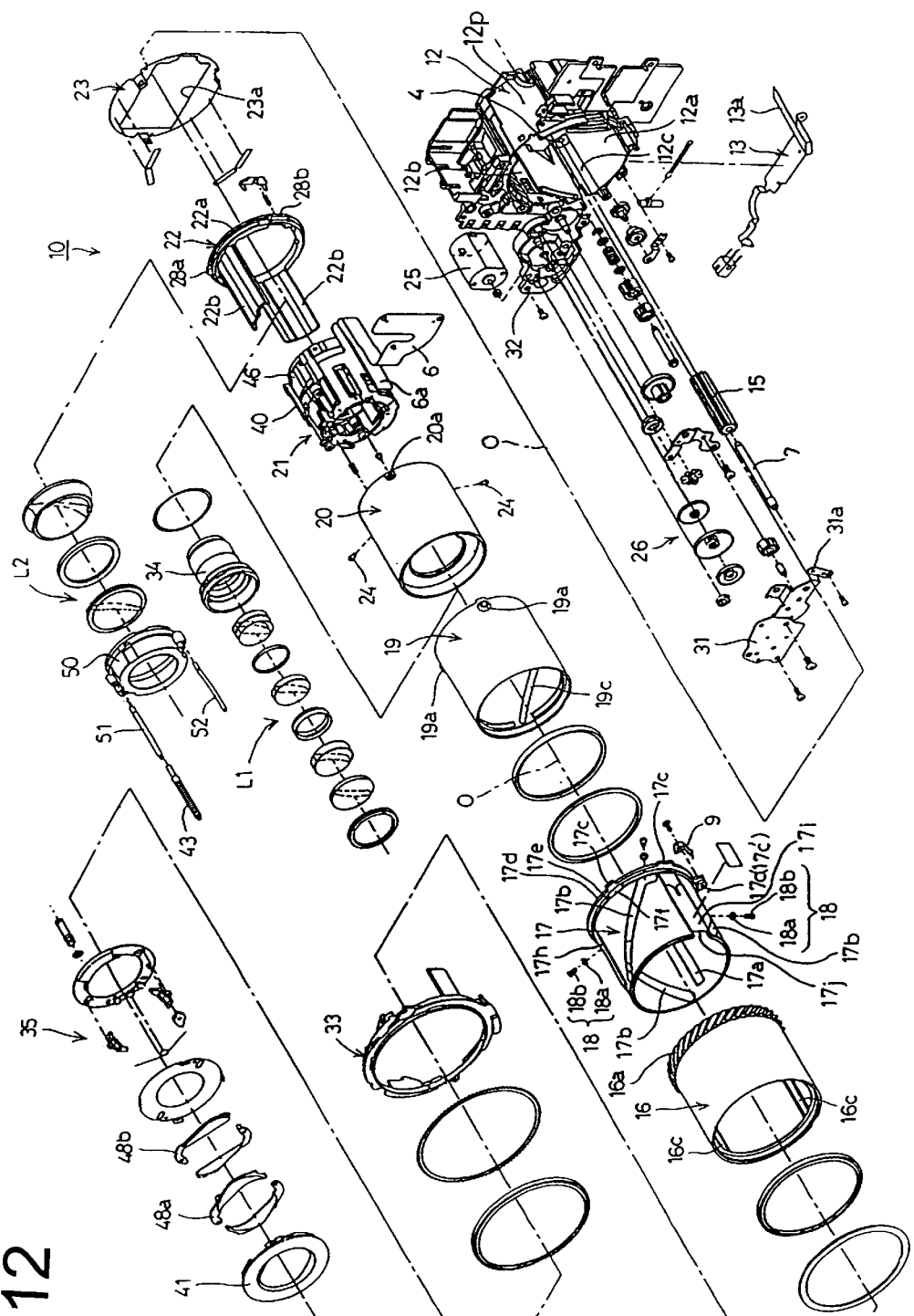
FIG. 12 is an exploded perspective view of the overall structure of the zoom lens barrel.

As shown in FIGS. 7 and 12, in the fixed lens barrel block 12, a gear housing 12c is provided which is recessed outwardly from an inner periphery of the cylindrical portion 12p of the fixed lens barrel block 12 in a radial direction while extending in the optical axis direction. In the gear housing 12c, a driving pinion 15 is rotatably held and extends in the optical axis direction. Both ends of an axial shaft 7 of the driving pinion 15 are rotatively supported by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion 12p of the fixed lens barrel block 12 so that the driving pinion 15 meshes with an outer peripheral gear 16b of the third moving barrel 16, as shown in FIG. 7.

Figure 15:
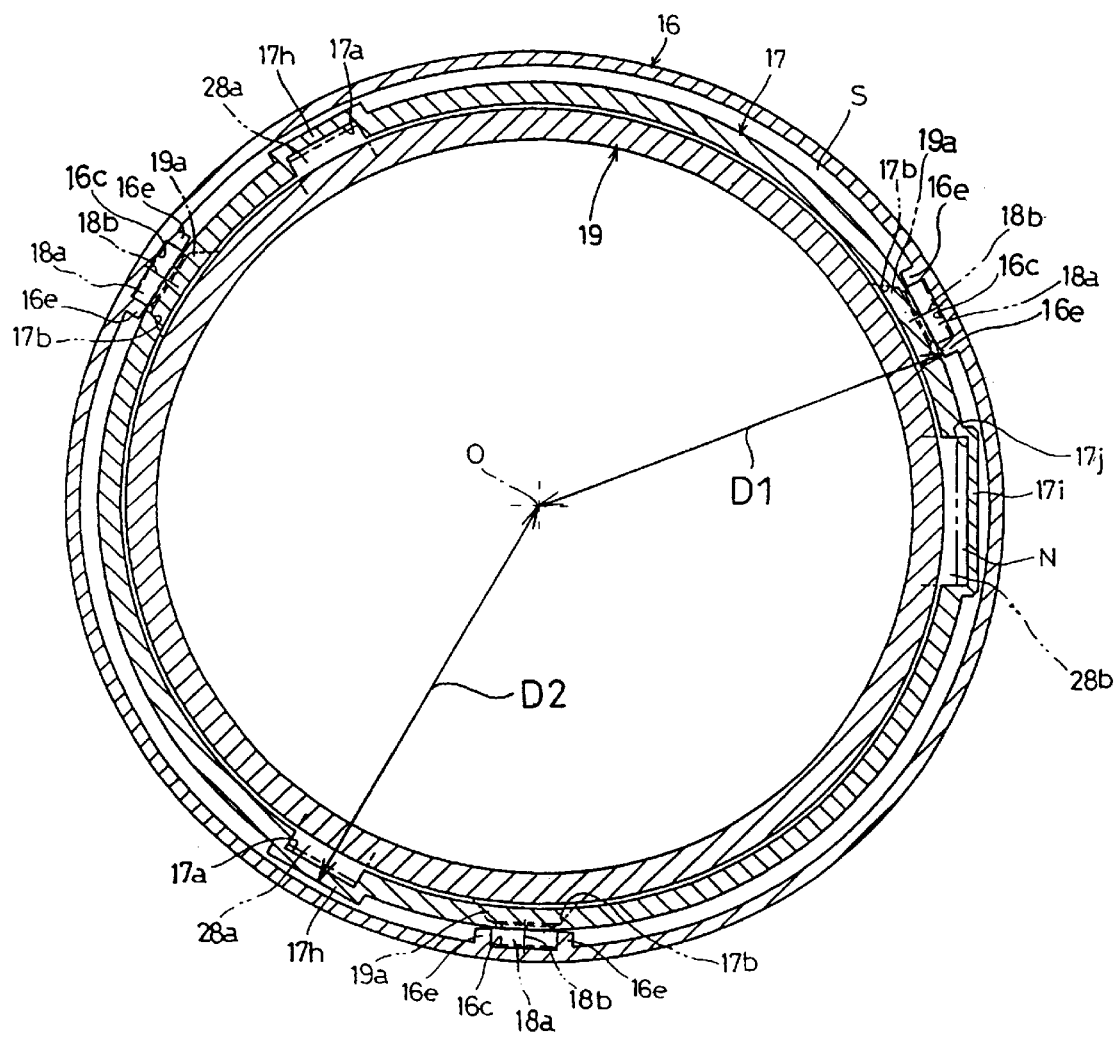
FIG. 15 is a schematic sectional view showing a positional relationship between the third moving barrel, a linear guide barrel and a second moving barrel, in the housed state.
Figure 16:
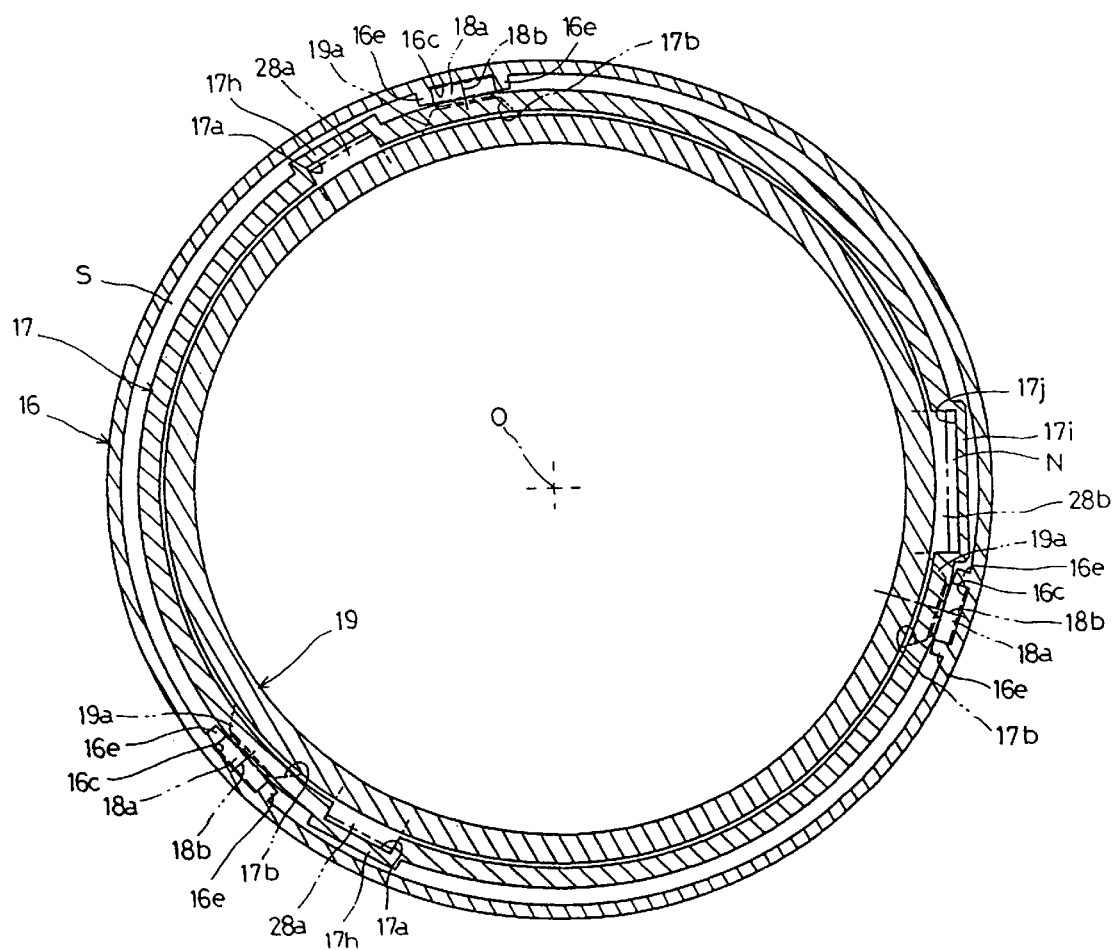
FIG. 16 is a schematic sectional view showing a positional relationship between the third moving barrel, the linear guide barrel and the second moving barrel, in the maximum extended state.
Figure 17:
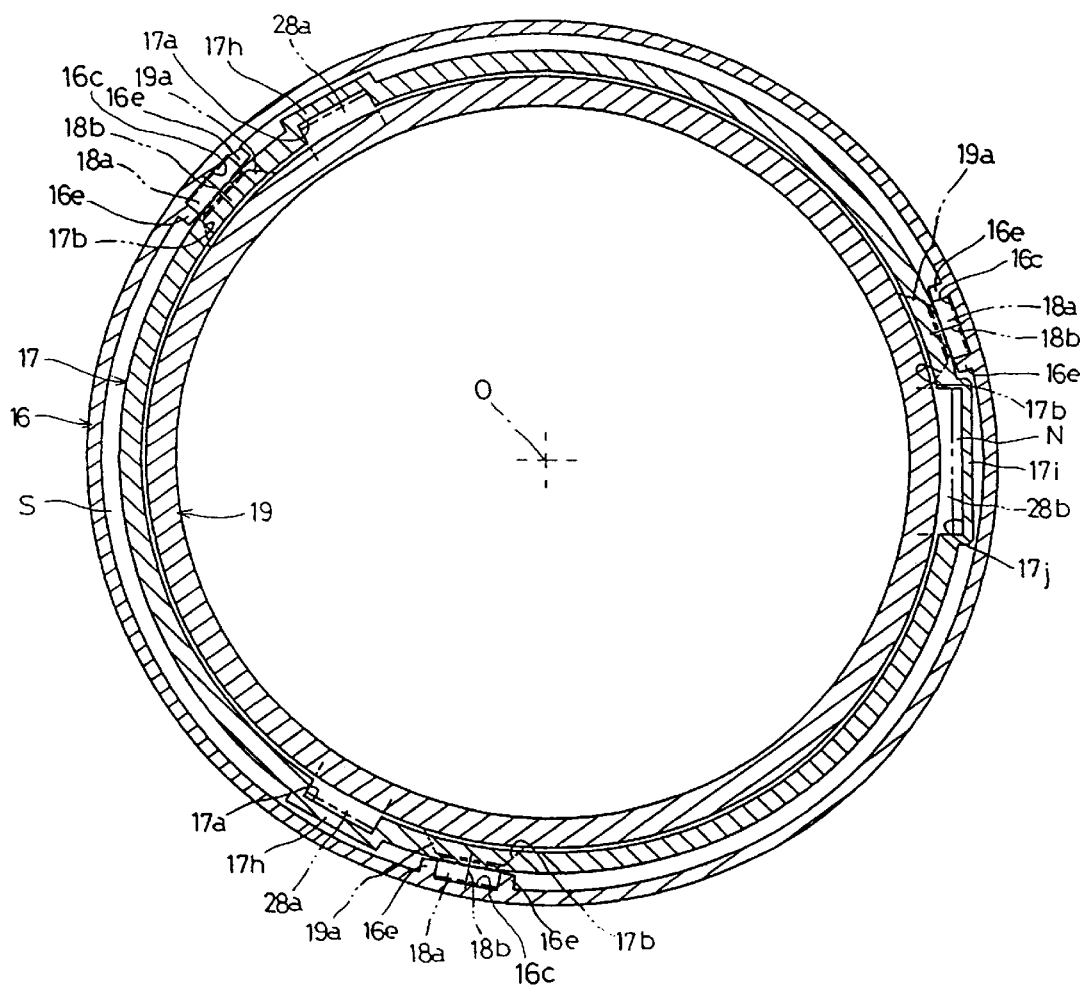
FIG. 17 is a schematic sectional view showing a positional relationship between the third moving barrel, the linear guide barrel and the second moving barrel, during assembly or disassembly of the zoom lens barrel.

On an inner periphery of the third moving barrel 16, a plurality of linear guide grooves 16c, each extending parallel to the optical axis O, are formed. For example, three linear guide grooves 16c may be provided. A guide rib 16e is formed on either side of each linear guide groove 16c. Each of the guide ribs 16e projects from an inner periphery of the third moving barrel 16 and extends parallel to each other. Therefore, each linear guide groove 16c is respectively defined by a pair of adjacent guide ribs 16e and an inner surface of the third moving barrel 16 (i.e., the bottom surface of the corresponding linear guide groove 16c) located between the pair of adjacent guide ribs 16e. Each guide rib 16e is located in an annular space S formed between the third lens barrel 16 and the linear guide barrel 17 which is fitted in the third lens barrel 16 as shown in FIGS. 15, 16 or 17.

Figure 6:
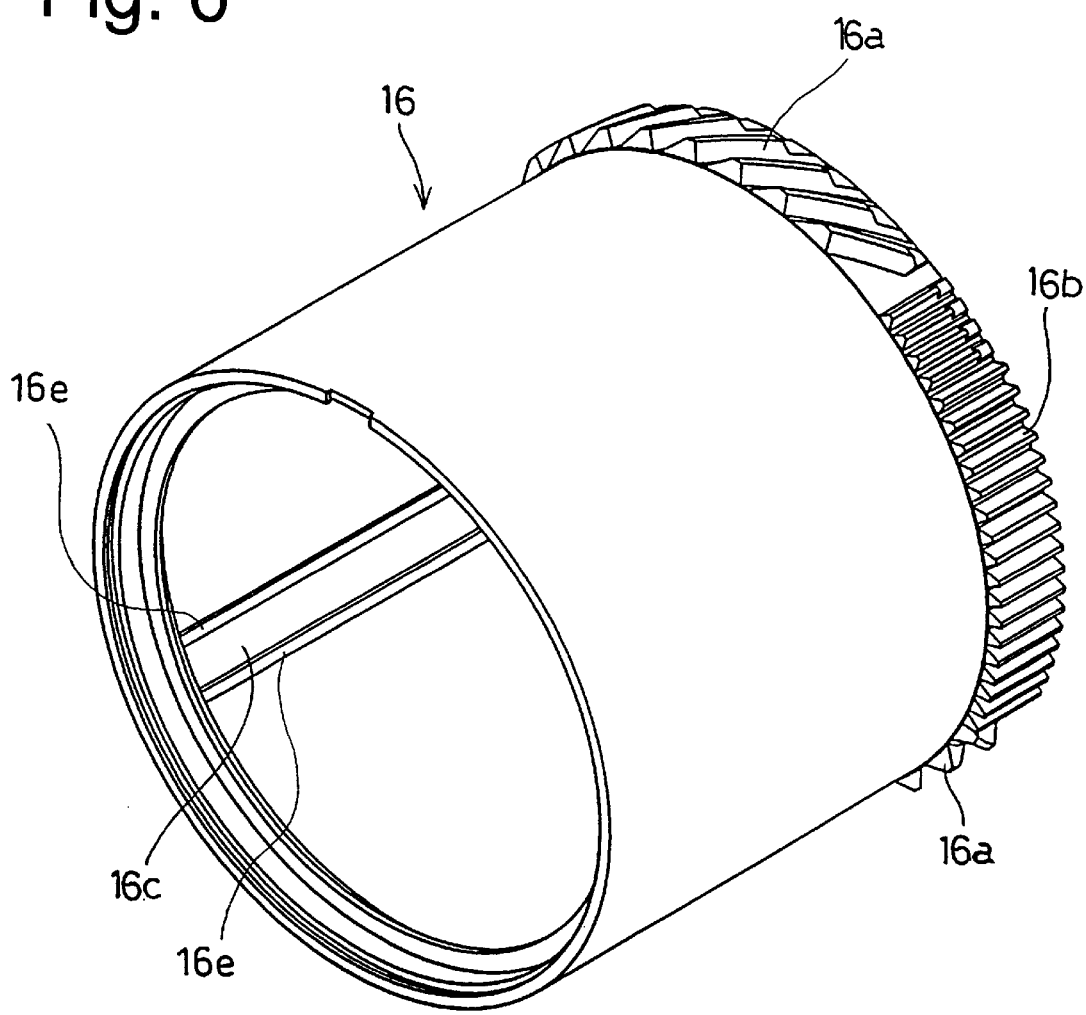
FIG. 6 is an enlarged schematic perspective view of a third moving barrel of the zoom lens barrel.

At an outer periphery of the rear end of the third moving barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third moving barrel 16 in the optical axis direction.

Figure 18:
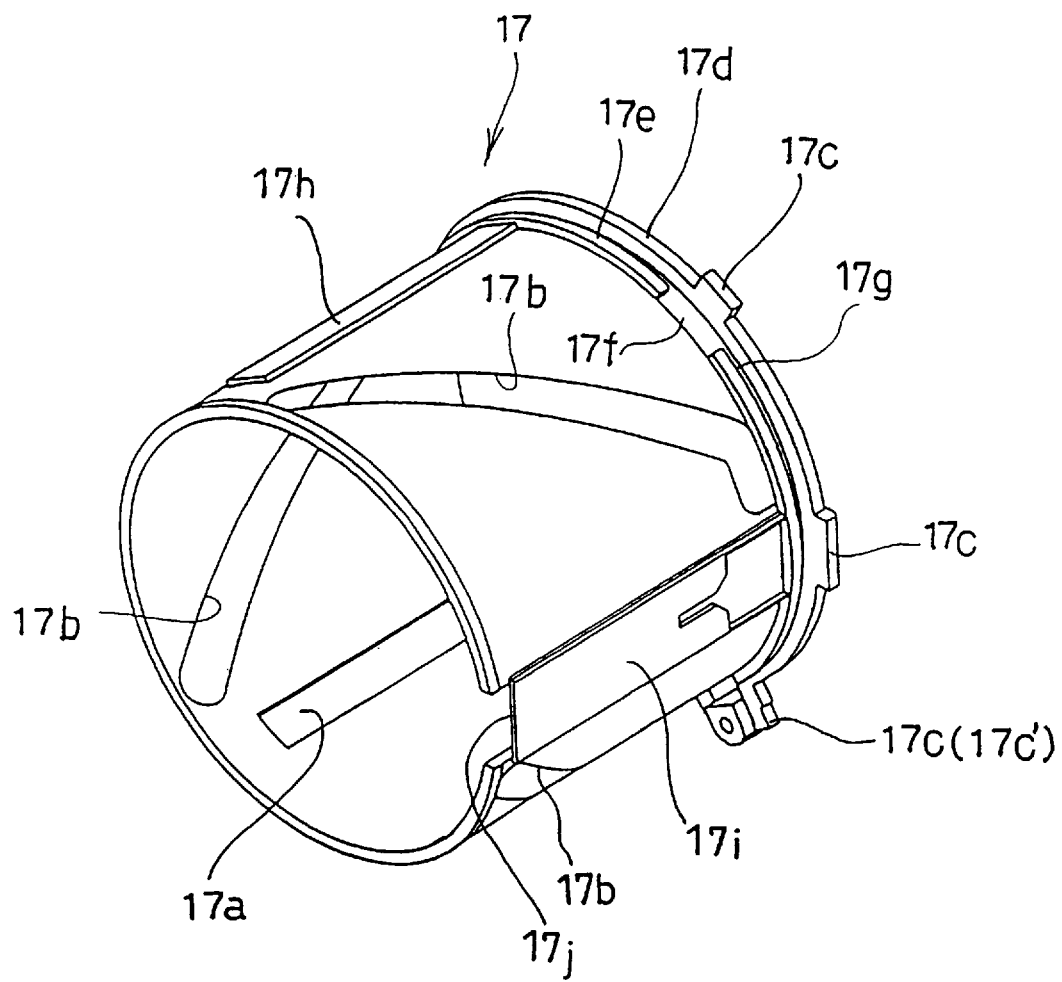
FIG. 18 is an enlarged perspective view of a linear guide barrel shown in FIG. 12.

As shown in FIG. 18, the linear guide barrel 17 is provided, on a rear part of an outer periphery thereof, with a rear end flange 17d. The rear end flange 17d has a plurality of engaging projections 17c each projecting away from the optical axis O in a radial direction. The linear guide barrel 17 is further provided with a retaining flange 17e in front of the rear end flange 17d. A circumferential groove 17g is formed between the rear end flange 17d and the retaining flange 17e. The retaining flange 17e has a radius smaller than the rear end flange 17d. The retaining flange 17e is provided with a plurality of cutout portions 17f. Each of the cutout portions 17f allows a corresponding engaging projection 16d to be inserted into the circumferential groove 17g, as shown in FIG. 11.

The third moving barrel 16 is provided, on an inner periphery of the rear end, with a plurality of engaging projections 16d. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 17). By rotating the third moving barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed to the read-end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, namely 17c'. The contacting terminal 9 is in slidable contact with the code plate 13a, fixed to the bottom of the linear guide groove 12b' to generate signals corresponding to focal length information during zooming.

On the inner periphery of the linear guide barrel 17, two linear guide grooves 17a (only one of which is shown in FIG. 18) and a linear guide groove 17j having a width wider than the width of either of the two linear guide grooves 17a are formed. Each linear guide groove 17a or 17j extends parallel to the optical axis O. The portion of the outer periphery of the linear guide barrel 17 which is located adjacent to either of the linear guide grooves 17a is formed as a raised portion 17h. The raised portion 17h is raised outwardly in a radial direction of the linear guide barrel 17 and extends in the optical axis direction. Likewise, the portion of the outer periphery of the linear guide barrel 17 which is located adjacent to the linear guide groove 17j is formed as a raised portion 17i. The raised portion 17i is raised outwardly in a radial direction of the linear guide barrel 17 and extends in the optical axis direction.

The amount by which each raised portion 17h or 17i is raised from the outer periphery of the linear guide barrel 17 is identical. Each raised portion 17h or 17i is located in the annular space S, together with the inward projections 16e. The thickness of the annular space S along a radial direction perpendicular to the optical axis O is less than the sum of the thickness (amount of projection) of any one of the inward projections 16e and the thickness (amount of projection) of any one of the outward projections 17h, and is slightly larger than either the thickness of any one of the inward projections 16e or the thickness of any one of the outward projections 17h. Accordingly, the raised portions 17h, 17i and the guide ribs 16e are positioned such that a distance (e.g., a distance D1 shown in FIG. 15) between the optical axis O and a surface of any one of the inward projections 16e closest to the optical axis O is less than a distance (e.g., a distance D2 shown in FIG. 15) between the optical axis O and a surface of any one of the outward projections 17h or 17i farthest from the optical axis O in a radial direction perpendicular to the optical axis O (i.e., D1<D2). Furthermore, each raised portion 17h or 17i is positioned in the annular space S so as not to interfere with either of the two adjacent guide ribs 16e when the third moving barrel 16 is rotated about the optical axis O with respect to the linear guide barrel 17. Namely, the raised portions 17h, 17i and the guide ribs 16e are formed such that the raised portions 17h, 17i and the guide ribs 16e does not interfere with one another within the range of rotation of the third moving barrel 16 relative to the linear guide barrel 17.

FIGS. 15 and 16 show the positional relationships of the third moving barrel 16 and the linear guide barrel 17 in a retracted state (housed state) and a maximum extended state (fully advanced state) of the zoom lens barrel 10, respectively. It will be appreciated from FIGS. 15 and 16 that the raised portions 17h, 17i and the guide ribs 16e do not interfere with one another in either the retracted state or the maximum extended state.

In the assembly of the zoom lens barrel 10, the linear guide barrel 17 is firstly inserted into the third moving barrel 16 so as to be supported by the third moving barrel 16, such that the third moving barrel 16 is rotatable relative to the linear guide barrel 17. Thereafter, the third moving barrel 16 is installed in the cylindrical portion 12p of the fixed lens barrel block 12, with the male helicoid 16a and the engaging projections 17c being correspondingly positioned relative to the female helicoid 12a and the linear guide grooves 12b, respectively. FIG. 17 shows the predetermined relative position of the third moving barrel 16 and the linear guide barrel 17 when the third moving barrel 16 is installed in the cylindrical portion 12p. This relative position of the third moving barrel 16 and the linear guide barrel 17 is the same as that when the third moving barrel 16 is removed from the cylindrical portion 12p during a disassembly of the zoom lens barrel 10. It will be appreciated from FIG. 17 that the raised portions 17h, 17i and the guide ribs 16e do not interfere with one another during either assembly or disassembly of the zoom lens barrel 10.

Figure 3:
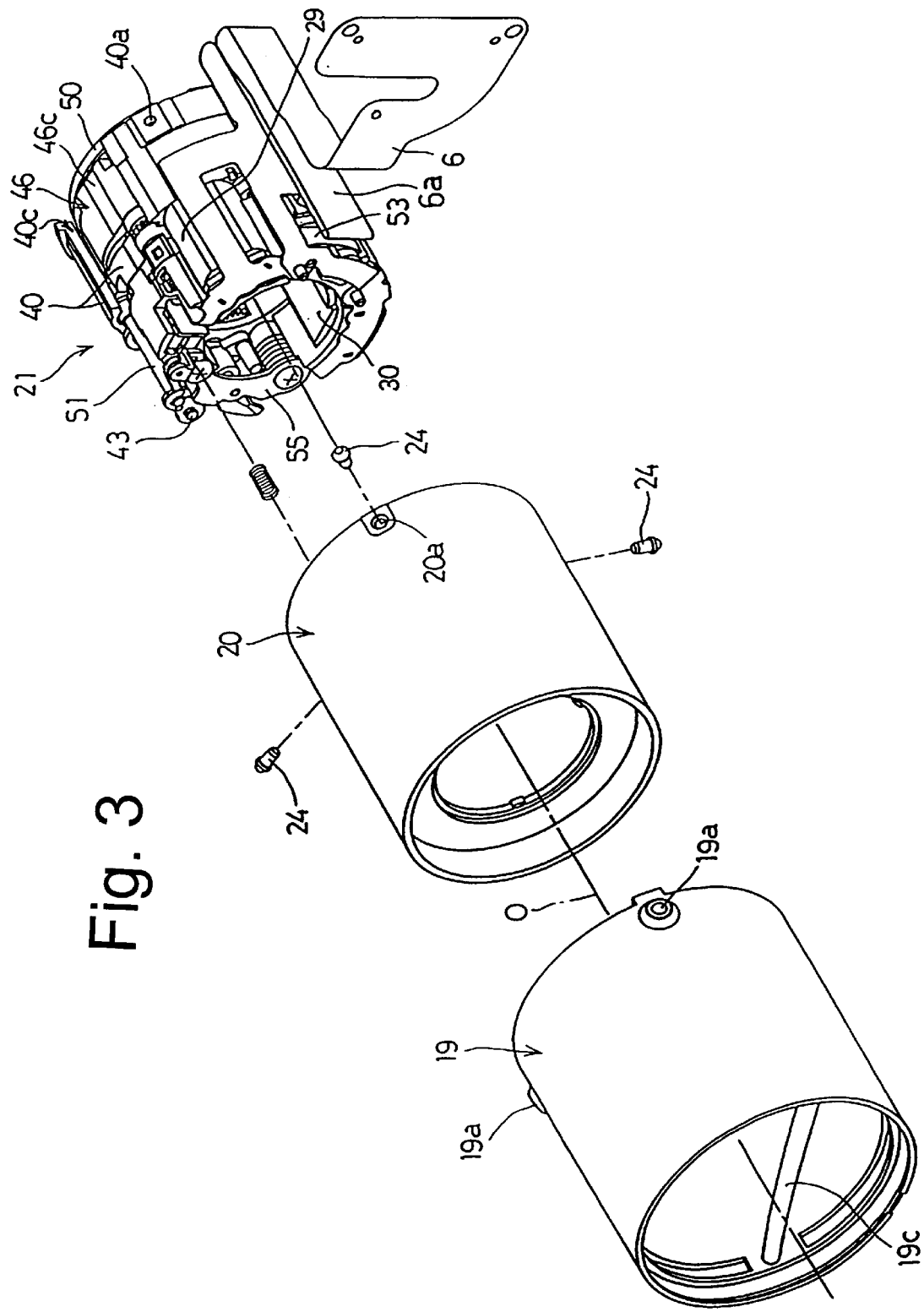
FIG. 3 is an enlarged exploded perspective view of a part of the zoom lens barrel.

Two engaging projections 28a formed on a linear guide member 22, respectively, engage with the linear guide grooves 17a and an engaging projection 28b formed on the linear guide member 22 engages with the linear guide groove 17j, so as to guide the linear guide barrel 17 along the optical axis O without rotating about the optical axis O. The tip of the engaging projection 28b is apart from the bottom of the linear guide groove 17j by a predetermined distance. With this structure, a space N is formed between the tip of the engaging projection 28b and the bottom of the linear guide groove 17j, as shown in FIGS. 15, 16 or 17. A flexible wiring strip 6a (see, for example, FIG. 3) which forms a part of a flexible circuit board 6 is placed in the space N along the linear guide groove 17j.

Figure 14:
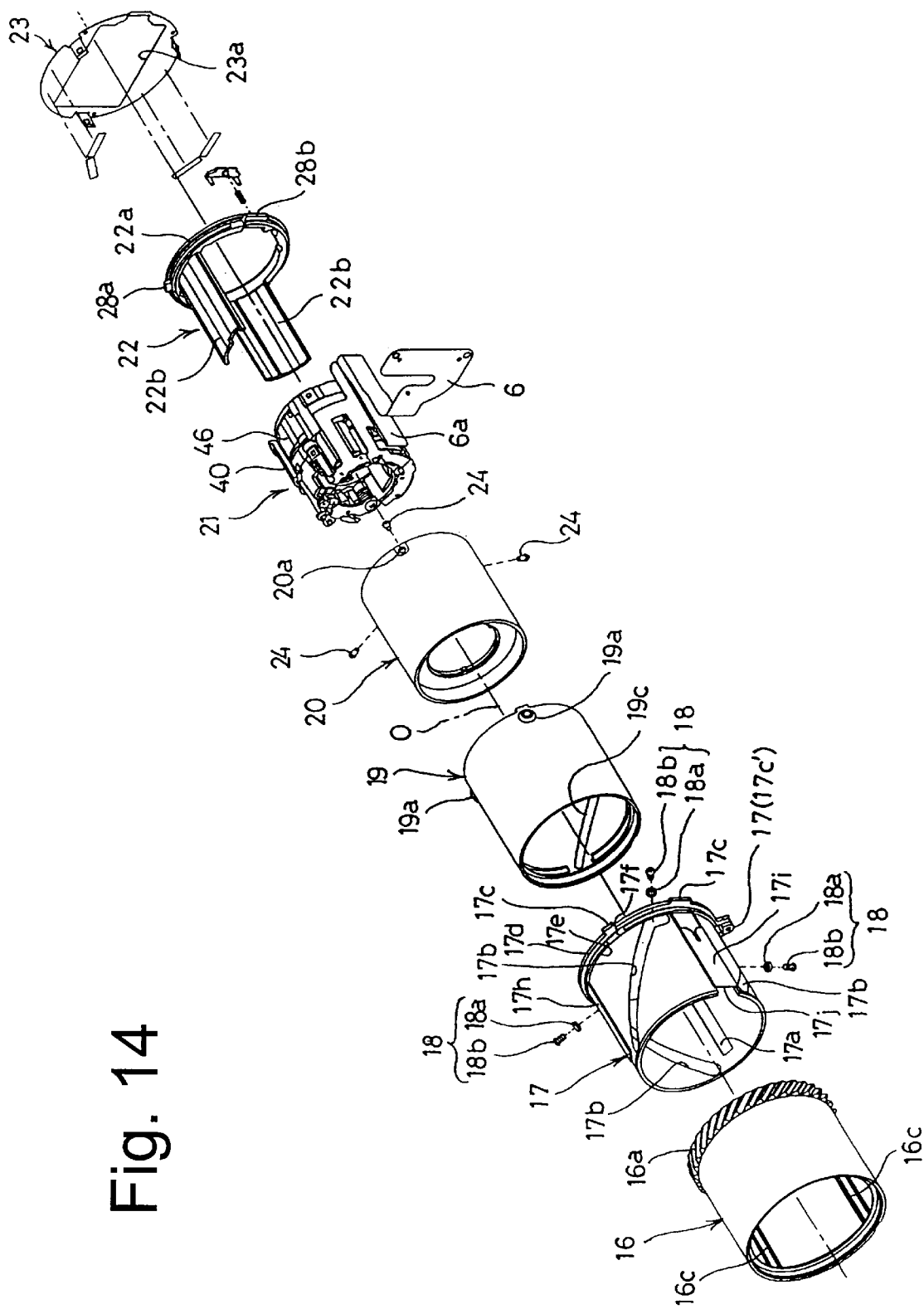
FIG. 14 is an exploded perspective view of some of the parts of the zoom lens barrel.

A plurality of lead slots 17b are also formed on the linear guide barrel 17 as shown in FIGS. 12, 14 or 18. For example, three lead slots 17b may be provided. The lead slots 17b are each formed oblique (inclined) to the optical axis O.

The second moving barrel 19 engages with the inner periphery of the linear guide barrel 17. On the inner periphery of the second moving barrel 19, a plurality of lead grooves 19c are provided in a direction inclined oppositely to the lead slots 17b. On the outer periphery of the rear end of the second moving barrel 19, a plurality of follower projections 19a are provided. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating. Therefore, the maximum amount of rotation of the third moving barrel 16 relative to the linear guide barrel 17 about the optical axis O is determined by the lead slots 17b. The shape of each lead slot 17b is determined such that the raised portions 17h, 17i and the guide ribs 16e do not interfere with one another when the third moving barrel 16 and the second moving barrel 19 rotate together in the same rotational direction through the engagement of the linear guide grooves 16c with the follower pins 18, to move the second moving barrel 19 along the optical axis O while rotating about the optical axis O through the engagement of the follower pins 18 with the lead grooves 17b. Because of this advantageous structure, the raised portions 17h, 17i and the guide ribs 16e do not interfere with one another at any time, i.e., when the zoom lens barrel 10 is in its maximum extended state, in its housed state, or in assembly or disassembly.

On the inner periphery of the second moving barrel 19, the first moving barrel 20 is engaged. The first moving barrel 20 is provided on an outer periphery of the rear thereof with a plurality of follower pins 24 each engaging with the corresponding inner lead groove 19c. At the same time the first moving barrel 20 is guided linearly by a linear guide member 22. The first moving barrel 20 is provided at the front end thereof with a decorative plate 41.

Figure 1:
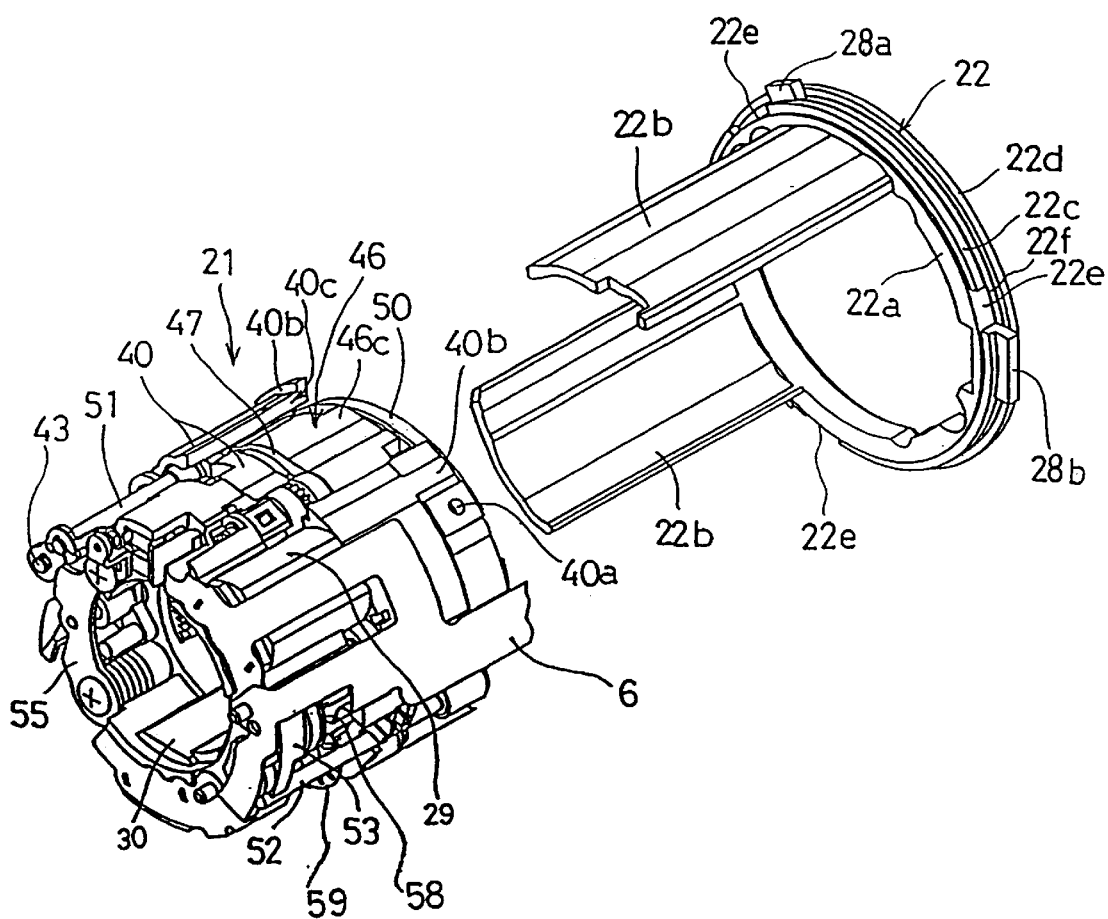
FIG. 1 is an enlarged schematic perspective view showing a part of a zoom lens barrel.
Figure 2:
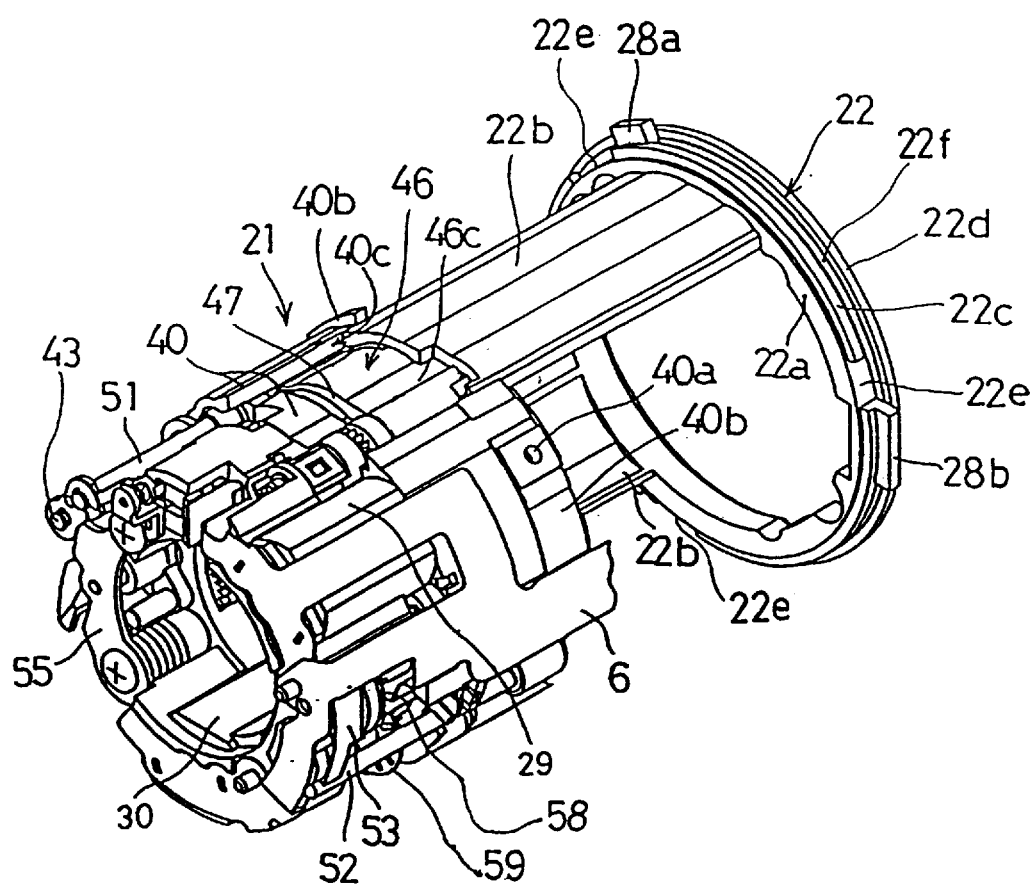
FIG. 2 is a schematic perspective view showing the part of the zoom lens barrel shown in FIG. 1 in an engaged state.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction.

The annular member 22a of the linear guide member 22 is connected to the rear of the second moving barrel 19, such that the linear guide member 22 and the second moving barrel 19 are capable of moving along the optical axis O as a whole and relatively rotating around the optical axis O. The linear guide member 22 is further provided on the outer periphery of the rear end with a rear end flange 22d. The linear guide member 22 is further provided in front of the rear end flange 22d with a retaining flange 22c. A circumferential groove 22f is formed between the rear end flange 22d and the retaining flange 22c. The retaining flange 22c has a smaller radius than the rear end flange 22d. The retaining flange 22c is provided with a plurality of cutout portions 22e, as shown in FIGS. 1 or 2, each allowing a corresponding engaging projection 19b to be inserted into the circumferential groove 22f, as shown in FIG. 11.

The second moving barrel 19 is provided on an inner periphery of the rear end thereof with a plurality of engaging projections 19b, each projecting towards the optical axis O in a radial direction. By inserting the engaging projections 19b into the circumferential groove 22f through the corresponding cutout portions 22e, the engaging projections 19b are positioned in the circumferential groove 22f between the flanges 22c and 22d. By rotating the second moving barrel 19 relative to the linear guide member 22, the engaging projections 19b are engaged with the linear guide member 22. With the above structure, when the second moving barrel 19 rotates in the forward or reverse rotational direction, the first moving barrel 20 moves linearly forwardly or rearwardly along the optical axis O, but is restricted from rotating.

Figure 9:
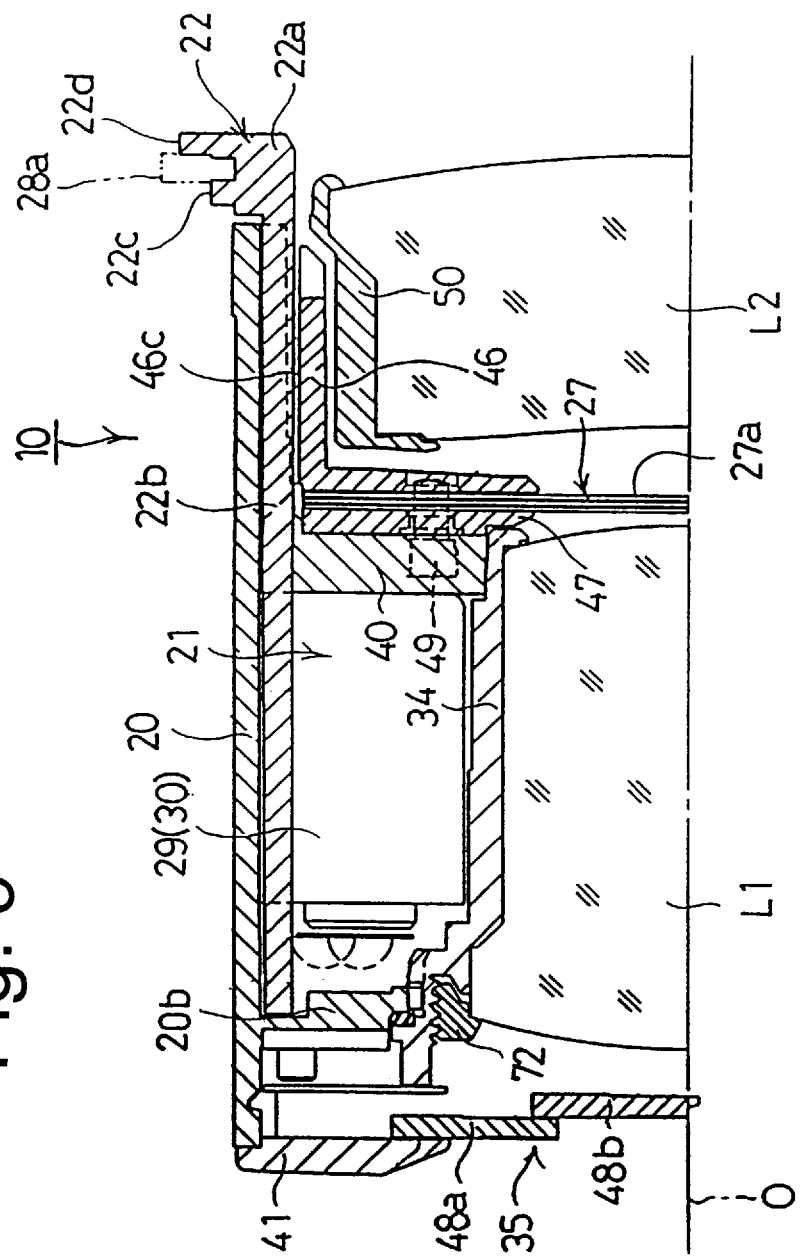
FIG. 9 is a sectional view of an upper part of the zoom lens barrel, illustrating essential elements in a housed state.

At the front of the first moving barrel 20, a barrier apparatus 35 having barrier blades 48a and 48b is mounted. On an inner peripheral face of the first moving barrel 20, the AF/AE shutter unit 21 having the shutter 27, consisting of three shutter blades 27a, is engaged and fixed as shown in FIG. 9. The AF/AE shutter unit 21 is provided with a plurality of fixing holes 40a formed at even angular intervals on the outer periphery of the shutter mounting stage 40. Only one of the fixing holes 40a appears in each of FIGS. 1–5.

Figure 4:
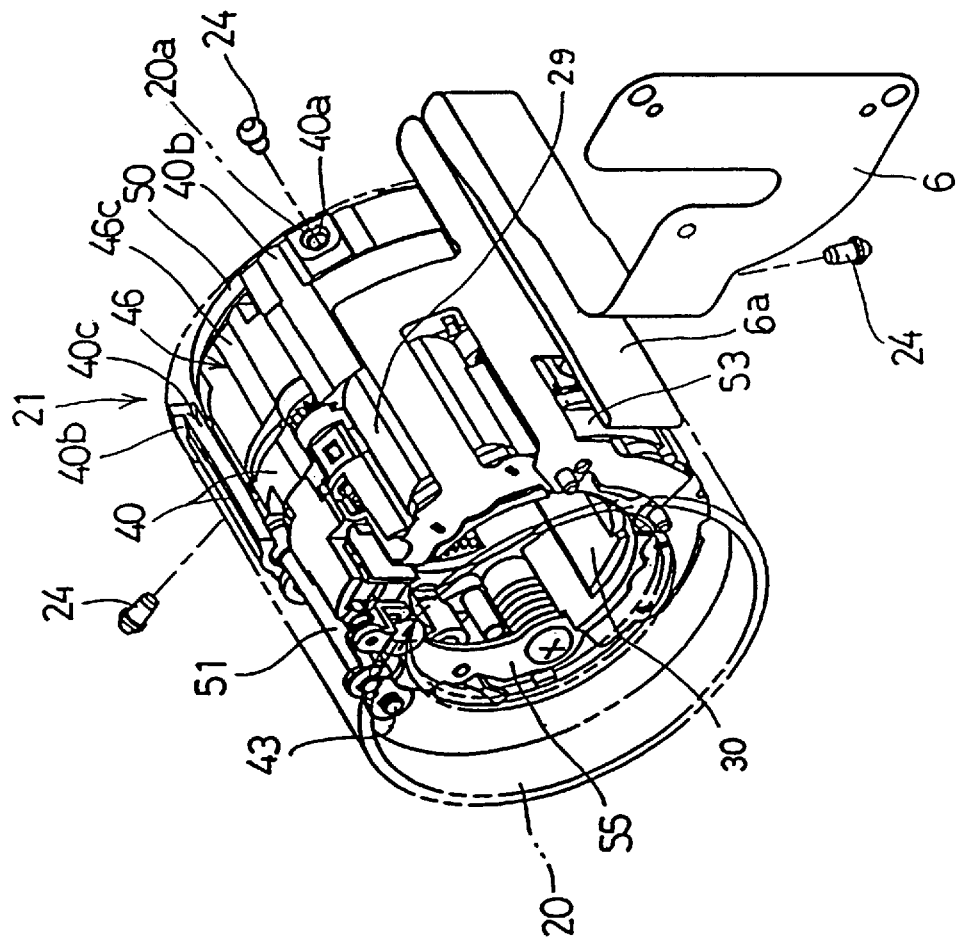
FIG. 4 is a schematic perspective view illustrating a state where an AF/AE shutter unit of the zoom lens barrel is mounted to a first moving barrel.

The aforementioned plurality of follower pins 24, which engage with the inner lead grooves 19c, also serve as a device for fixing the AF/AE shutter unit 21 to the first moving barrel 20. The follower pins 24 are inserted in holes 20a, formed on the first moving barrel 20, and fixed in the fixing holes 40a. With this arrangement the AF/AE shutter unit 21 is secured to the first moving barrel 20 as shown in FIG. 4. In FIG. 4 the first moving barrel 20 is indicated by phantom lines. The follower pins 24 may be fixed by an adhesive, or the pins 24 may be formed as screws to be screwed into the fixing holes 40a.

Figure 5:
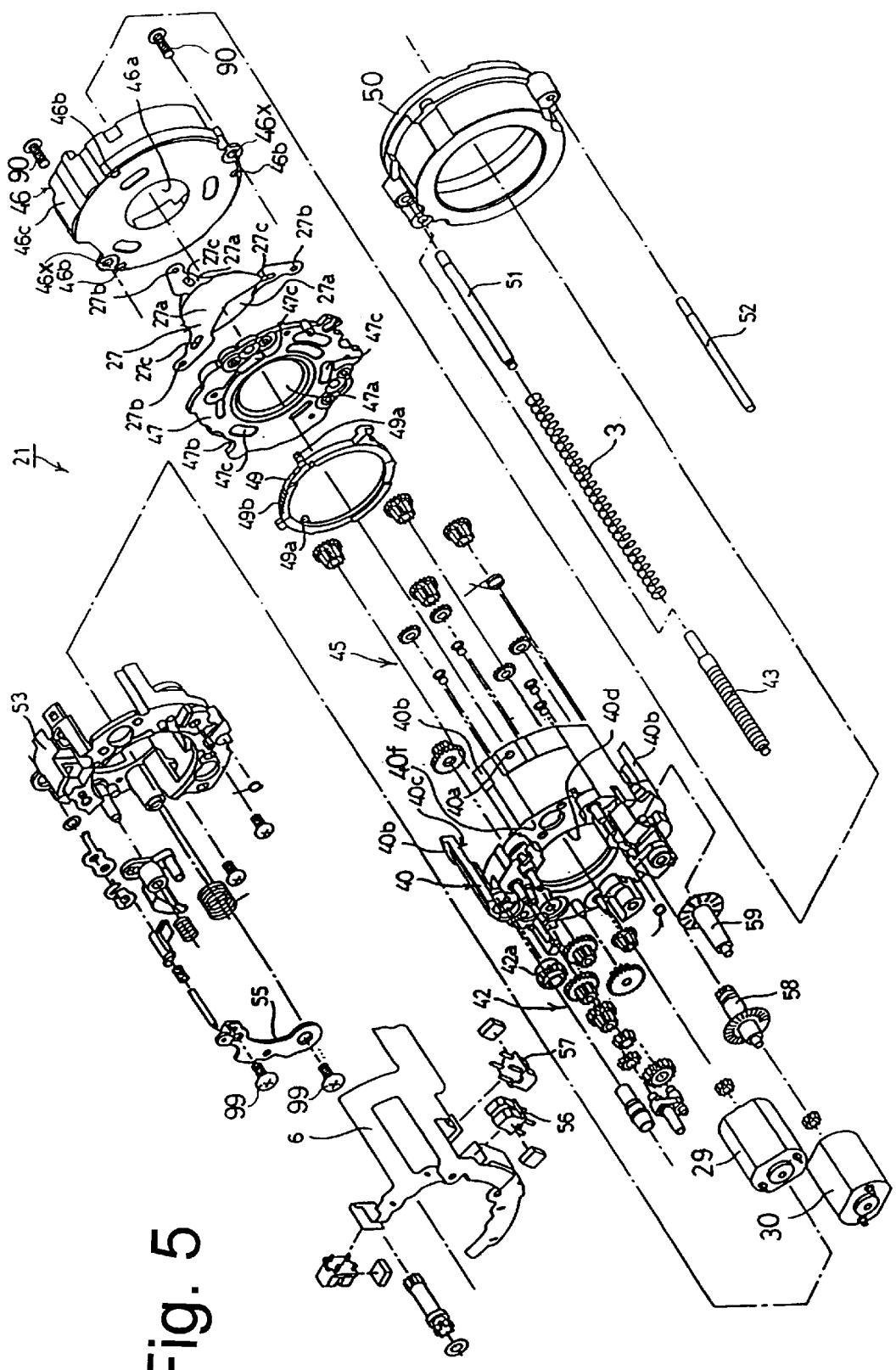
FIG. 5 is an exploded perspective view illustrating main parts of the AF/AE shutter unit of the zoom lens barrel shown in FIGS. 1, 2, 3 or 4.

As illustrated in FIGS. 5 and 12, the AF/AE shutter unit 21 is provided with the shutter mounting state 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. The shutter mounting stage 40 supports the lens supporting barrel 34, the AE motor 29, and the rear lens group driving motor 30. The shutter mounting stage 40 is provided with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22 so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photointerrupters 56 and 57 which are connected to a flexible printed circuit board 6, and rotating disks 58 and 59 which have a plurality of radially formed slits provided in the circumferential direction. An encoder for detecting whether the rear lens group driving motor 30 is rotating and for detecting an amount of rotation of the rear lens group driving motor 30 consists of the photointerrupter 57 and the rotating disk 59. An AE motor encoder for detecting whether the AE motor 29 is rotating and for detecting an amount of rotation of the AE motor 29 consists of the photointerrupter 56 and the rotating disk 58.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 5, the front end of the shutter blade supporting ring 46 is provided with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47 positioned in front of the shutter blade supporting ring 46 is provided with a circular aperture 47a, aligned with the circular aperture 46a of the shutter blade supporting ring 46, and with three pivotal shafts 47b (only one of which is illustrated in FIG. 5) at respective positions opposite the three supporting holes 46b. Each shutter blade 27a is provided at one end thereof with a hole 27b into which the corresponding pivotal shaft 47b is inserted, so that each shutter blade 27a is rotatable about the corresponding pivotal shaft 47b. The major part of each shutter blade 27a that extends normal to the optical axis O from the pivoted end is formed as a light interceptive portion. All three light interceptive portions of the shutter blades 27a together prevent ambient light which enters the front lens group L1, from entering the circular apertures 46a and 47a when the shutter blades 27a are closed. Each shutter blade 27a is further provided between the hole 27b and the light interceptive portion thereof, with a slot 27c, through which the corresponding operating projection 49a is inserted. The supporting member 47 is fixed to the shutter blade supporting ring 46 in such a manner that each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46x provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center and is restricted to move in the axial direction. The screw shaft 43, one end of which is fixed to the lens supporting barrel 50, engages with the female thread hole. Accordingly, the driving gear 42*a* and the screw shaft 43 together constitute a feed screw mechanism. In such a manner, when the driving gear 42*a* rotates forwardly or reversely due to driving by the rear lens group driving motor 30, the screw shaft 43 respectively moves forwardly or rearwardly with respect to the driving gear 42*a*, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws 99. The motors 29, 30 and the photointerrupters 56, 57 are connected to the flexible printed circuit board 6. One end of the flexible printed circuit board 6 is fixed to the shutter mounting stage 40.

After the first, second and third moving barrels 20, 19 and 16, and the AF/AE shutter unit 21, etc. are assembled, the aperture plate 23 is fixed to the rear of the linear guide barrel 17, and an annular retaining member 33 is fixed at the front of the fixed lens barrel block 12.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, and the present invention may also be applied to another type of zoom lens optical system including one or more fixed lens groups.

In addition, in the above embodiment, the rear lens group L1 is provided as a component of the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be realized in such a manner by providing the rear lens group L2 as a separate member from the AF/AE shutter unit 21 (which is provided with the shutter mounting stage 40), the circular driving member 49, the supporting member 47, the shutter blades 27, the shutter blade supporting ring 46 and the like, and where the rear lens group L2 is supported by a supporting member other than the AF/AE shutter unit 21.

In the zoom lens camera of the present embodiment, the operation by rotation of the whole optical unit driving motor 25 and the rear lens group driving motor 30 will now be described with reference to FIGS. 8, 9, 10 and 11.

As shown in FIGS. 9 or 11, when the zoom lens barrel 10 is at the most retracted (withdrawn) position, i.e., the lens-housed condition, as the power switch is turned ON, the whole optical unit driving motor 25 is driven to rotate its drive shaft in the first rotational direction by a small amount. This rotation of the motor 25 is transmitted to the driving pinion 15 through a gear train 26, which is supported by a supporting member 32 integrally formed with the fixed lens barrel block 12, to rotate the third moving barrel 16 in one predetermined rotational direction to advance forwardly along the optical axis O. Therefore, the second moving barrel 19 and the first moving barrel 20 are each advanced by a small amount in the optical axis direction, along with the third moving barrel 16. Consequently, the camera is placed into a state capable of photographing, with the zoom lens positioned at the widest position, i.e., the wide end. At this stage, because the amount of movement of the linear guide barrel 17, with respect to the fixed lens barrel block 12, is detected by the relative sliding between the code plate 13*a* and the contacting terminal 9, the focal length of the zoom lens barrel 10, i.e., the front and rear lens groups L1 and L2, is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60 so that the third moving barrel 16 rotates in the rotational direction to advance along the optical axis O via the driving pinion 15 and the outer peripheral gear 16*b*. Therefore, the third moving barrel 16 is advanced from the fixed lens barrel block 12 according to the relationship between the female helicoid 12*a* and the male helicoid 16*a*. At the same time, the linear guide barrel 17 moves forwardly in the optical axis direction together with the third moving barrel 16, without relatively rotating with respect to the fixed lens barrel block 12, according to the relationship between the engaging projections 17*c* and the linear guide grooves 12*b*. At this time, the simultaneous engagement of the follower pins 18 with the respective lead slots 17*b* and linear guide grooves 16*c* causes the second moving barrel 19 to move forwardly relative to the third moving barrel 16 in the optical axis direction, while rotating together with the third moving barrel 16 in the same rotational direction relative to the fixed lens barrel block 12. The first moving barrel 20 moves forwardly from the second moving barrel 19 in the optical axis direction, together with the AF/AE shutter unit 21, without relatively rotating with respect to the fixed lens barrel block 12, because of the above-noted structures in which the first moving barrel 20 is guided linearly by the linear guide member 22 and in which the follower pins 24 are guided by the lead grooves 19*c*. During such movements, according to the fact that the moving position of the linear guide barrel 17 with respect to the fixed lens barrel block 12 is detected by the relative slide between the code plate 13*a* and the contacting terminal 9, the focal length set by the zoom operation device 62 is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60 so that the third moving barrel 16 rotates in the rotational direction to retract into the fixed lens barrel block 12 together with the linear guide barrel 17. At the same time, the second moving barrel 19 is retracted into the third moving barrel 16 while rotating in the same direction as that of the third moving barrel 16, and the first moving barrel 20 is retracted into the rotating second moving barrel 19 together with the AF/AE shutter unit 21. During the above retraction driving, as in the case of the advancing driving as described above, the rear lens group driving motor 30 is not driven.

Figure 8:
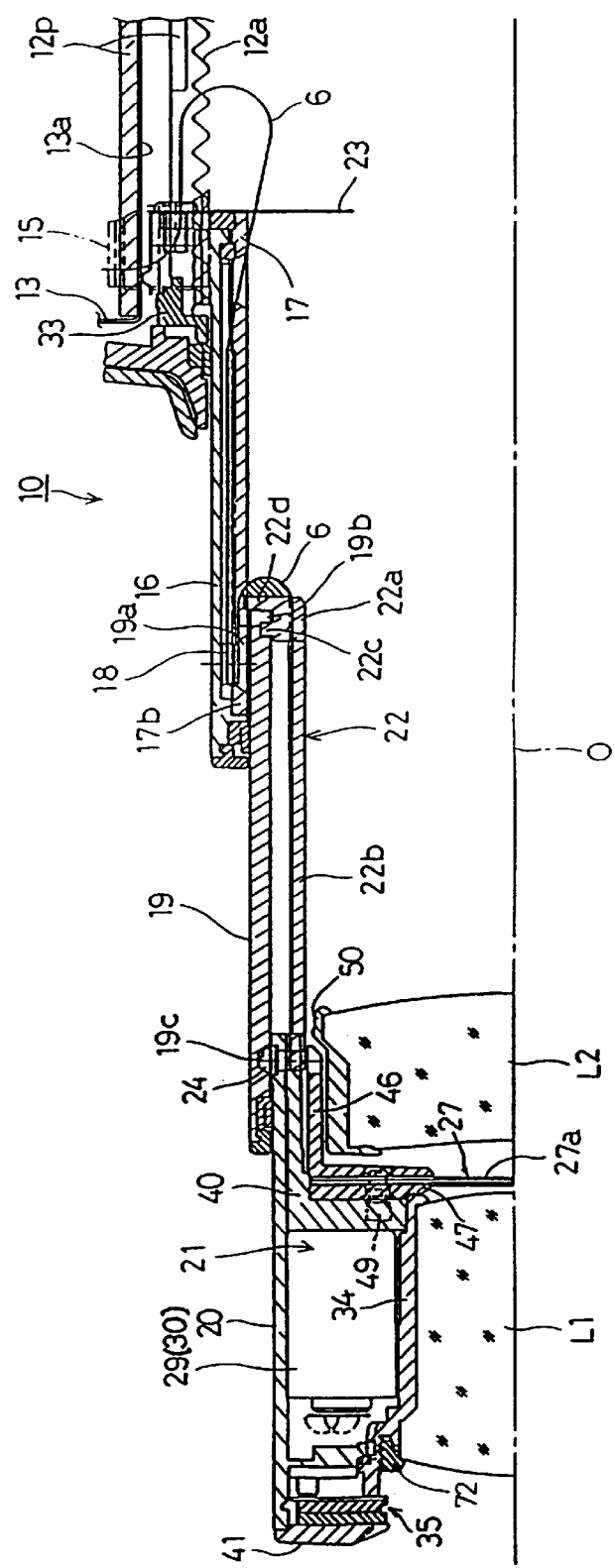
FIG. 8 is a sectional view of an upper part of the zoom lens barrel in a maximum extended state.
Figure 10:
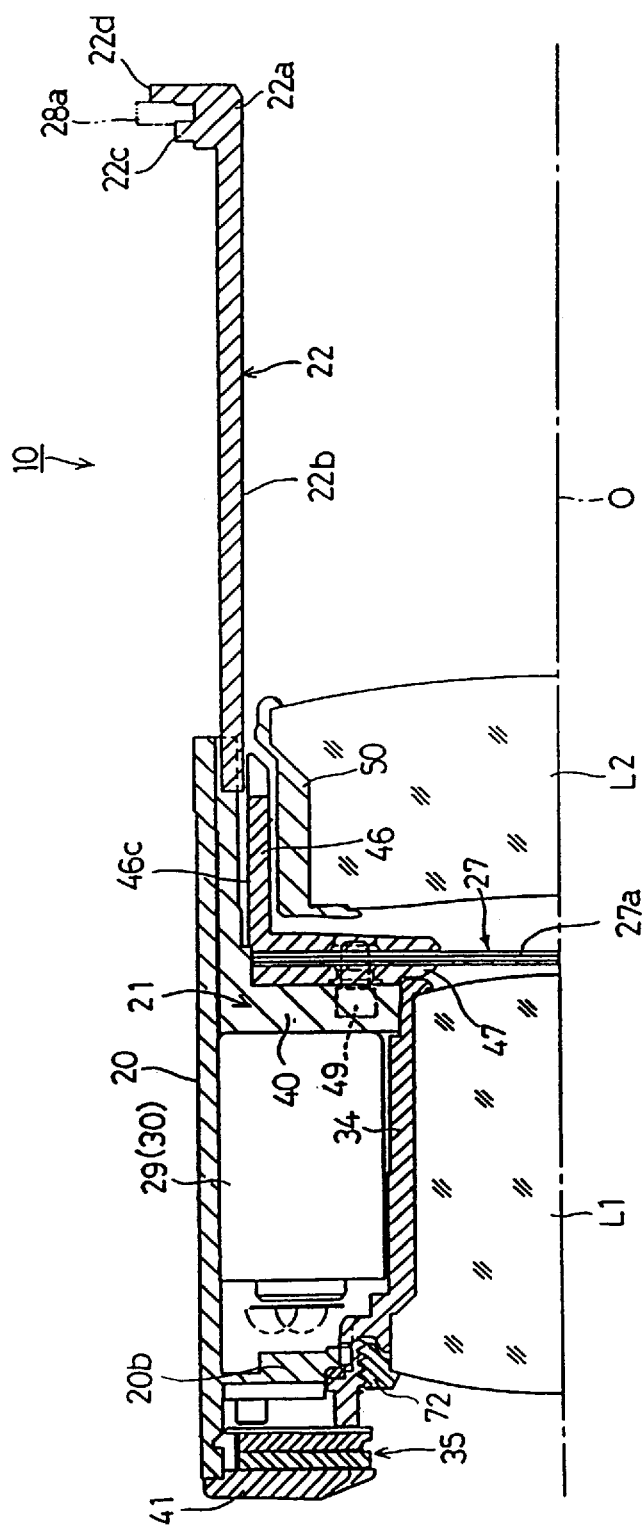
FIG. 10 is a sectional view of the upper part of the zoom lens barrel shown in FIG. 9 in the maximum extended state.

While the zoom lens barrel 10 is driven during the zooming operation, since the rear lens group driving motor 30 is not driven, the front lens group L1 and the rear lens group L2 move as a whole, thus a constant distance is maintained between each of the lens groups L1 and L2 as shown in FIGS. 8 or 10. The focal length input via the zoom code plate 13*a* and the contacting terminal 9 may be indicated on an LCD panel (not shown) provided on the camera body.

At any focal length set by the zoom operating device 62, when the release button is depressed by a half-step, the object distance measuring apparatus 64 is actuated to measure a subject distance. At the same time, the photometering apparatus 65 is actuated to measure a subject brightness. Thereafter, when the release button is fully depressed, the whole optical unit driving motor 25 and the rear lens group driving motor 30 are each driven by respective amounts in accordance with the focal length information (set in advance by the photographer) and the subject distance information obtained by the object distance measuring apparatus 64 so that the front and rear lens groups L1 and L2 are respectively moved to specified positions to obtain the specified focal length and bring the subject into focus. Immediately after the subject is brought into focus, the AE motor 29 is driven via the AE motor controller 66, to rotate the circular driving member 49 by an amount corresponding to the subject brightness information obtained by the photometering apparatus 65 so that the shutter 27 is driven to open the shutter blades 27a by a specified amount for a proper exposure. Immediately after such a shutter release operation, in which the three shutter blades 27a are opened and subsequently closed is completed, the whole optical unit driving motor 25 and the rear lens group driving motor 30 are both driven to move the front lens group L1 and the rear lens group L2 to the respective initial positions which they were at prior to a shutter release.

As can be understood from the foregoing, in the embodiment of the zoom lens barrel 10 as noted above, when the third moving barrel 16 is driven to move forwardly or rearwardly in accordance with the operation of the zoom operating device 62, the guide ribs 16e do not interfere with the raised portions 17h, 17i, as they move in the annular space S when the third moving barrel 16 rotates. In addition, in assembly or disassembly of the zoom lens barrel 10, the guide ribs 16e do not interfere with the raised portions 17h, 17i either. Specifically, when the third moving barrel 16, which supports the linear guide barrel 17 therein, is inserted into or taken out of the cylindrical portion 12p.

As can be understood from the foregoing, in the present embodiment of the zoom lens barrel 10, since the raised portions 17h, 17i and the guide ribs 16e are positioned such that a distance between the optical axis O and a surface of any one of the inward projections 16e closest to the optical axis O is less than a distance between the optical axis O and a surface of any one of the outward projections 17h or 17i farthest from the optical axis O in a radial direction perpendicular to the optical axis O, the gap (annular space S) between the third moving barrel 16 and the linear guide barrel 17 is small. That is, the third moving barrel 16 and the linear guide barrel 17 are arranged close to each other in a radial direction as compared with a conventional zoom lens camera, which contributes much to making the diameter of the zoom lens barrel 10 small and compact.

The present invention may also be applied to any other type of zoom lens, e.g., a zoom lens used for a video camera or a still video camera.

The present invention is not limited solely to the three-stage delivery type of zoom lens having three moving barrels, but may be applied to a two-stage or more than three-stage delivery type of zoom lens having two or more than three moving barrels.

In the present embodiment of the zoom lens barrel 10, "Fantas Coat SF-6" is used as the coating 72e. However, a different type of coating may be used as the coating 72e as long as it is waterproof and makes the circular abutting surface 72b a smooth surface such that substantially no gap is formed between the circular abutting surface 72b and the circumferential portion fp.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A zoom lens comprising:
    an outer barrel driven to rotate about an optical axis of said zoom lens, said outer barrel comprising at least one first guide groove formed on an inner periphery of said outer barrel, said at least one first guide groove extending in a direction of said optical axis; and
    an inner barrel positioned inside said outer barrel so that said outer barrel is rotatable relative to said inner barrel about said optical axis, said inner barrel comprising at least one second guide groove formed on an inner periphery of said inner barrel, said at least one second guide groove extending in said direction of said optical axis;
    wherein said at least one first guide groove is defined by at least one inward projection which projects inwardly from said inner periphery of said outer barrel;
    wherein said at least one second guide groove is defined by an outward projection which projects outwardly from an outer periphery of said inner barrel; and
    wherein said at least one inward projection and said outward projection are positioned in an annular space formed between said outer barrel and said inner barrel such that a distance between said optical axis and a surface of said at least one inward projection closest to said optical axis is less than a distance between said optical axis and a surface of said outward projection farthest from said optical axis in a radial direction perpendicular to said optical axis.

2. The zoom lens according to claim 1, wherein said at least one inward projection comprises two inward projections which extend adjacent to each other in said direction of said optical axis.

3. The zoom lens according to claim 1, further comprising:
    at least one lead slot formed on said inner barrel and extending obliquely to said optical axis;
    an innermost barrel positioned within said inner barrel so that said innermost barrel is rotatable relative to said inner barrel about said optical axis, said innermost barrel comprising at least one follower pin which engages with said at least one first guide groove through said at least one lead slot; and
    a linear guide member guided along said optical axis without rotation about said optical axis, said linear guide member comprising at least one engaging projection which engages with said at least one second guide groove.

4. The zoom lens according to claim 3, wherein said at least one lead slot is formed on said inner barrel such that said at least one inward projection does not interfere with said outward projection when said innermost barrel rotates about said optical axis relative to said inner barrel.

5. The zoom lens according to claim 1, further comprising a stationary barrel having a first thread formed on an inner periphery thereof, wherein said outer barrel further comprises a second thread formed on an outer periphery at a rear end thereof, said outer barrel being fitted within said stationary barrel, and said second thread meshing with said first thread so that said outer barrel moves along said optical axis when driven to rotate about said optical axis.

6. The zoom lens according to claim 5, wherein said inner barrel moves along said optical axis together with said outer barrel while said outer barrel rotates about said optical axis relative to said inner barrel, said inner barrel moving along said optical axis without rotating about said optical axis relative to said stationary barrel.

7. A zoom lens comprising:
an outer barrel driven to rotate about an optical axis of said zoom lens, said outer barrel comprising at least one first guide groove formed on an inner periphery of said outer barrel, said at least one first guide groove extending in a direction of said optical axis;
an inner barrel positioned inside said outer barrel so that said outer barrel is relatively rotatable with respect to said inner barrel about said optical axis, said inner barrel comprising at least one second guide groove formed on an inner periphery of said inner barrel and extending in said direction of said optical axis, and at least one lead slot extending obliquely to said optical axis;
an innermost barrel positioned within said inner barrel so that said innermost barrel is relatively rotatable with respect to said inner barrel about said optical axis, said innermost barrel comprising at least one follower pin which engages with said at least one first guide groove through said at least one lead slot; and
a linear guide member guided along said optical axis without rotating about said optical axis, said linear guide member comprising at least one engaging projection which engages with said at least one second guide groove,
wherein said at least one first guide groove is defined by at least one inward projection which projects inwardly from said inner periphery of said outer barrel,
wherein said at least one second guide groove comprises an outward projection which projects outwardly from an outer periphery of said inner barrel, and
wherein said at least one inward projection and said outward projection are positioned in an annular space formed between said outer barrel and said inner barrel such that a distance between said optical axis and a surface of said at least one inward projection closest to said optical axis is less than a distance between said optical axis and a surface of said outward projection farthest from said optical axis in a radial direction perpendicular to said optical axis.

8. A zoom lens comprising:
an outer barrel driven to rotate about an optical axis of said zoom lens, said outer barrel comprising at least one first guide groove formed on an inner periphery of said outer barrel, said at least one first guide groove extending in a direction of said optical axis;
an inner barrel positioned inside said outer barrel so that said outer barrel is relatively rotatable with respect to said inner barrel about said optical axis, said inner barrel comprising at least one second guide groove formed on an inner periphery of said inner barrel, said at least one second guide groove extending in said direction of said optical axis;

wherein said at least one first guide groove comprises at least one inward projection which projects inwardly from said inner periphery of said outer barrel,
wherein said at least one second guide groove comprises an outward projection which projects outwardly from an outer periphery of said inner barrel, and
wherein said at least one inward projection and said outward projection are positioned in an annular space formed between said outer barrel and said inner barrel on a circumference having a center coincident with said optical axis.

9. A zoom lens comprising:
an outer barrel driven to rotate about an optical axis of said zoom lens, said outer barrel comprising at least one first guide groove formed on an inner periphery of said outer barrel, said at least one first guide groove extending in a direction of said optical axis;
an inner barrel positioned inside said outer barrel so that said outer barrel is relatively rotatable with respect to said inner barrel about said optical axis, said inner barrel comprising at least one second guide groove formed on an inner periphery of said inner barrel, said at least one second guide groove extending in said direction of said optical axis;
wherein said at least one first guide groove comprises at least one inward projection which projects inwardly from said inner periphery of said outer barrel,
wherein said at least one second guide groove comprises an outward projection which projects outwardly from an outer periphery of said inner barrel, and
wherein said at least one inward projection and said outward projection are positioned in an annular space formed between said outer barrel and said inner barrel such that said at least one inward projection would interfere with said outward projection in the case where said outer barrel is rotated by a rotational amount which is beyond a predetermined maximum rotational amount of said outer barrel relative to said inner barrel.

10. A zoom lens comprising:
an outer barrel driven to rotate about an optical axis of said zoom lens, said outer barrel comprising at least one first guide groove formed on an inner periphery of said outer barrel, said at least one first guide groove extending in a direction of said optical axis;
an inner barrel positioned inside said outer barrel so that said outer barrel is relatively rotatable with respect to said inner barrel about said optical axis, said inner barrel comprising at least one second guide groove formed on an inner periphery of said inner barrel, said at least one second guide groove extending in said direction of said optical axis;
wherein said at least one first guide groove is defined by at least one inward projection which projects inwardly from said inner periphery of said outer barrel,
wherein said at least one second guide groove is defined by an outward projection which projects outwardly from an outer periphery of said inner barrel, and
wherein a thickness of an annular space formed between said outer barrel and said inner barrel in a radial direction perpendicular to said optical axis is less than a sum of a thickness of said at least one inward projection and a thickness of said outward projection.

* * * * *

UNITED STATES PATENT AND TRADEMARK OFFICE
CERTIFICATE OF CORRECTION

PATENT NO. : 5,812,325
DATED : September 22, 1998
INVENTOR(S) : Hiroshi Nomura et al.

Page 1 of 1

It is certified that error appears in the above-identified patent and that said Letters Patent is hereby corrected as shown below:

On the Title Page:

At Foreign Application Priority Data, item [30] line 9 (first column, line 2) of the printed patent, "January 29, 1996" should be --- January 26, 1996---.

At Reference Cited, U.S. Patent Documents, item [56] (first column, line 27, document eleven) of the printed patent, "1/1996" should be ---6/1996---.

Signed and Sealed this

Seventeenth Day of July, 2001

*Attest:*

NICHOLAS P. GODICI
*Attesting Officer*    Acting Director of the United States Patent and Trademark Office